(12) United States Patent
Lua et al.

(10) Patent No.: US 10,453,511 B2
(45) Date of Patent: Oct. 22, 2019

(54) CIRCUIT ARRANGEMENT, METHOD OF FORMING AND OPERATING THE SAME

(71) Applicant: Agency for Science, Technology and Research, Singapore (SG)

(72) Inventors: Sunny Yan Hwee Lua, Singapore (SG); Aarthy Mani, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 16/079,511

(22) PCT Filed: Feb. 16, 2017

(86) PCT No.: PCT/SG2017/050067
§ 371 (c)(1),
(2) Date: Aug. 23, 2018

(87) PCT Pub. No.: WO2017/146644
PCT Pub. Date: Aug. 31, 2017

(65) Prior Publication Data
US 2019/0057731 A1    Feb. 21, 2019

(30) Foreign Application Priority Data

Feb. 25, 2016 (SG) .......................... 10201601428W

(51) Int. Cl.
*G11C 11/16*     (2006.01)
*H03K 3/45*      (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC .............. G11C 11/161; G11C 11/1693; G11C 11/1675; G11C 11/1673; G11C 11/1697; H01L 43/02; H01L 27/228; H03K 3/45
See application file for complete search history.

(56) References Cited

U.S. PATENT DOCUMENTS 5,453,949 A * 9/1995 Wiedmann ............ G11C 11/412
365/154
2012/0134199 A1   5/2012 Zhu et al.
(Continued)

FOREIGN PATENT DOCUMENTS

WO        2015/047194 A1    4/2015

OTHER PUBLICATIONS

International Preliminary Report on Patentability for International Application No. PCT/SG2017/050067 dated Nov. 8, 2017, pp. 1-24.
(Continued)

*Primary Examiner* — Harry W Byrne
*Assistant Examiner* — Sultana Begum
(74) *Attorney, Agent, or Firm* — Winstead, P.C.

(57) ABSTRACT

Various embodiments may provide a circuit arrangement. The circuit arrangement may include a first spin-orbit torque magnetic tunnel junction cell, a second spin-orbit torque magnetic tunnel junction cell, a first driver circuit arrangement, a second driver circuit arrangement, and a read circuit arrangement. The circuit arrangement allows for the operation of a non-volatile flip-flop based on spin-orbit torque effect.

20 Claims, 25 Drawing Sheets

(51) Int. Cl.
    *H01L 27/22* (2006.01)
    *H01L 43/02* (2006.01)
(52) U.S. Cl.
    CPC ........ *G11C 11/1693* (2013.01); *H01L 27/228* (2013.01); *H01L 43/02* (2013.01); *H03K 3/45* (2013.01); *G11C 11/1697* (2013.01)

(56) References Cited

U.S. PATENT DOCUMENTS

2014/0056061 A1   2/2014   Khvalkovskiy et al.
2014/0169068 A1*  6/2014   Lee .................... G11C 13/0064
                                                         365/148
2015/0213868 A1   7/2015   Wu et al.

OTHER PUBLICATIONS

Bishnoi et al., "Non-Volatile Non-Shadow Flip-Flop Using Spin Orbit Torque for Efficient Normally-off Computing," Design Automation Conference (ASP-DAC), 2016 21st Asia and South Pacific, Jan. 28, 2016, pp. 769-774.
Jabeur et al., "Spin Orbit Torque Non-Volatile Flip-Flop for High Speed and Low Energy Applications," IEEE Electron Device Letters, vol. 35, No. 3, Mar. 2014, pp. 408-410.
Wang et al., "Perpendicular-Anisotropy Magnetic Tunnel Junction Switched by Spin-Hall-Assisted Spin-Transfer Torque," Journal of Physics D: Applied Physics, vol. 48, 2015, pp. 1-7.

* cited by examiner

NVFF structure (a) symbol, (b) master register architecture (c) slave register, (d) writing circuit.

| Parameter | Value | Units |
| --- | --- | --- |
| Free Layer Thickness | 0.9 | nm |
| MgO Thickness | 0.85 | nm |
| MTJ diameter | 40 | nm |
| Saturation Magnetization, Ms | $0.9 \times 10^6$ | A/m |
| Magnetic Anisotropy, Hk | $8 \times 10^4$ | A/m |
| Spin orbit efficiency, p | 0.62 | - |
| Damping constant, alpha | 0.1 | - |
| Spin hall angle | 0.3 | - |
| Length (SoT) | 120 | nm |
| Width (SoT) | 100 | nm |
| Thickness (SoT) | 3 | nm |
| Resistivity (SoT) | 200 | µΩ.cm |
| Gyromagnetic ratio, Gamma | $17.6 \times 10^{11}$ | rads$^{-1}$ T$^{-1}$ |
| Rlow | 4.5 | KΩ |
| Rhigh | 9.9 | KΩ |

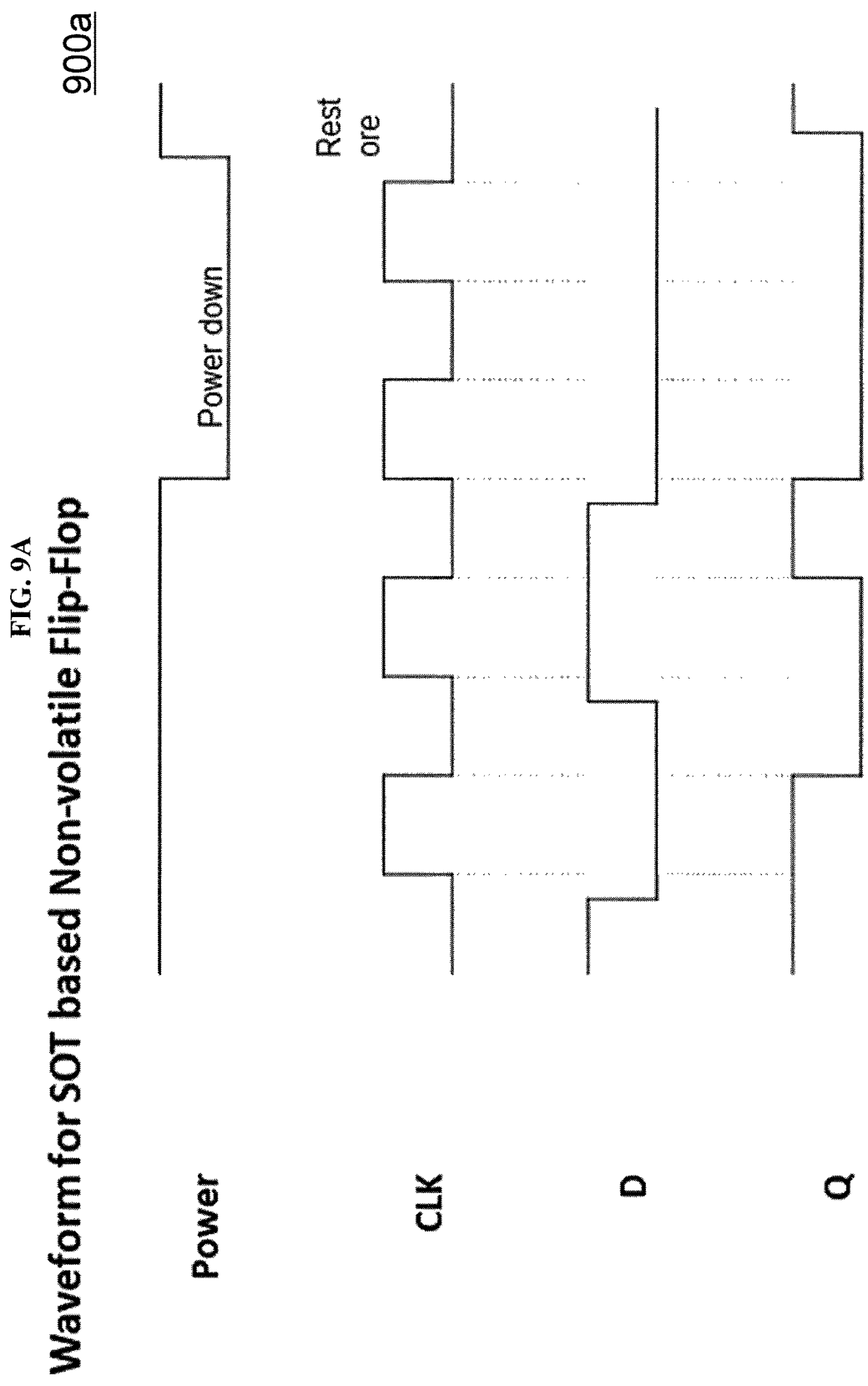

* $V_{WRITE1}$ & $V_{WRITE2}$ can be equal or different

| Parameter | Serial Write | Parallel Write | Change |
|---|---|---|---|
| Clock Frequency | 1GHz | 1.25GHz | 0.25GHz (1.25X) |
| Driver Size | 750nm | 1.6μm | 850nm (2.14X) |
| Write Current | 110μA | 110μA | 0 |
| Setup time | 110ps | 70ps | 40ps |
| Hold Time | - | 90ps | 90ps |
| Precharge Time (Write) | - | ~90ps | - |
| Cell Write Time | 207ps | 104ps | 103ps (~50%) |
| Delay (D → Q) | 845ps | 717ps | 128ps (~15%) |
| Memory Core Power | 66μW | 149μW | 83μW** (~2.25X) |
| Power (D → Q) | 124μW | 466μW @ 1.25GHz<br>395μW @ 1GHz | 342μW*** (~3.75X)<br>271μW (~3.18X) |
| Power Delay Product | 104fJ | 334fJ | 230fJ (~3.2X) |
| Energy Delay Product | 8.788e-23 | 2.294e-22 | 1.415e-22 (2.4X) |

FIG. 11B

| Parameter | Serial Write | Parallel Write (1) | Parallel Write (2) | Change (Parallel Write (1)) | Change (Parallel Write (2)) |
|---|---|---|---|---|---|
| Clock Frequency | 1GHz | 1.25GHz | 1GHZ | 0.25GHz (1.25X) | Nil |
| Driver Size | 750nm | 1.6µm | 1.6µm | 850nm(2.14X) | 850nm(2.14X) |
| Write Current | 80µA | 80µA | 80µA | Nil | nil |
| Setup time | 110ps | 70ps | 70ps | 40ps | 40ps |
| Hold Time | - | 90ps | 80ps | 90ps | 80ps |
| Precharge Time (Write) | - | ~90ps | ~90ps | - | - |
| Cell Write Time | 207ps | 104ps | 121ps | 103ps (~50%) | 86ps (~41%) |
| Delay (D → Q) | 845ps | 717ps | 825.7ps | 128ps (~15%) | 20ps(2%) |
| Memory Core Power | 66µW | 149µW | 140µW | 83µW (~2.25X) | 74µW (2.12X) |
| Power (D → Q) | 124µW | 466µW | 419µW | 342µW (~3.75X) | 295µW (3.38X) |
| Power Delay Product | 104fJ | 334fJ | 345.9fJ | 230fJ (~3.2X) | 241fJ (3.32X) |
| Energy Delay Product | 8.788e-23 | 2.294e-22 | 2.85e-22 | 1.415e-22 (2.6X) | 1.975e-22 (3.2X) |

1100b

CIRCUIT ARRANGEMENT, METHOD OF FORMING AND OPERATING THE SAME

CROSS-REFERENCE TO RELATED APPLICATION

This application claims the benefit of priority of Singapore application No. 10201601428W filed on Feb. 25, 2016, the contents of it being hereby incorporated by reference in its entirety for all purposes.

TECHNICAL FIELD

Various aspects of this disclosure relate to circuit arrangements. Various embodiments may relate to methods of forming circuit arrangements and/or methods of operating circuit arrangements.

BACKGROUND

Magnetic tunnel junction (MTJ) based on spin-orbit torque (SOT) effect is a three terminal device. It is attractive as the reversal of the magnetization of the storage layer of the MTJ is achieved through the control of the electrical current flow-direction in the SOT electrode, which in turn generates transverse spin current due to spin-orbit interaction. Spin-orbit torque (SOT) effect may enhance MTJ. In particular, the reliability and endurance of the MTJ are greatly improved since little or no direct current flows through the MTJ.

Conventional non-volatile flip-flops may suffer from slow speed due to built-up of parasitic resistance. In addition, conventional devices may be difficult to fabricate due to complex layout.

SUMMARY

Various embodiments may provide a circuit arrangement. The circuit arrangement may include a first spin-orbit torque magnetic tunnel junction cell having a reference terminal, a first electrode terminal, and a second electrode terminal. The circuit arrangement may also include a second spin-orbit torque magnetic tunnel junction cell having a reference terminal, a first electrode terminal, and a second electrode terminal. The circuit arrangement may additionally include a first driver circuit arrangement connected to the second electrode terminal of the first spin-orbit torque magnetic tunnel junction cell and the first electrode terminal of the second spin-orbit torque magnetic tunnel junction cell. The circuit arrangement may also include a second driver circuit arrangement connected to the first electrode terminal of the first spin-orbit torque magnetic tunnel junction cell and the second electrode terminal of the second spin-orbit torque magnetic tunnel junction cell. The circuit arrangement may further include a read circuit arrangement connected to the reference terminal of the first spin-orbit torque magnetic tunnel junction cell and the reference terminal of the second spin-orbit torque magnetic tunnel junction cell. The first driver circuit arrangement and the second driver circuit arrangement may be configured so that a first write current flowing from the first driver circuit arrangement to the second driver circuit arrangement generates a first logic state in the first spin-orbit torque magnetic tunnel junction cell and a second logic state in the second spin-orbit torque magnetic tunnel junction cell, and a second write current flowing from the second driver circuit arrangement to the first driver circuit arrangement generates the second logic state in the first spin-orbit torque magnetic tunnel junction cell and the first logic state in the second spin-orbit torque magnetic tunnel junction cell. The read circuit arrangement may be configured to flow a first sense current through the first spin-orbit torque magnetic tunnel junction cell and a second sense current through the second spin-orbit torque magnetic tunnel junction cell for determining a logic state of the first spin-orbit torque magnetic tunnel junction cell and a logic state of the second spin-orbit torque magnetic tunnel junction cell.

Various embodiments may provide a method of forming a circuit arrangement. The method may include providing a first spin-orbit torque magnetic tunnel junction cell having a reference terminal, a first electrode terminal, and a second electrode terminal. The method may also include providing a second spin-orbit torque magnetic tunnel junction cell having a reference terminal, a first electrode terminal, and a second electrode terminal. The method may further include connecting a first driver circuit arrangement to the second electrode terminal of the first spin-orbit torque magnetic tunnel junction cell and the first electrode terminal of the second spin-orbit torque magnetic tunnel junction cell. The method may additionally include connecting a second driver circuit arrangement to the first electrode terminal of the first spin-orbit torque magnetic tunnel junction cell and the second electrode terminal of the second spin-orbit torque magnetic tunnel junction cell. The method may also include connecting a read circuit arrangement to the reference terminal of the first spin-orbit torque magnetic tunnel junction cell and the reference terminal of the second spin-orbit torque magnetic tunnel junction cell. The first driver circuit arrangement and the second driver circuit arrangement may be configured so that a first write current flowing from the first driver circuit arrangement to the second driver circuit arrangement generates a first logic state in the first spin-orbit torque magnetic tunnel junction cell and a second logic state in the second spin-orbit torque magnetic tunnel junction cell, and a second write current flowing from the second driver circuit arrangement to the first driver circuit arrangement generates the second logic state in the first spin-orbit torque magnetic tunnel junction cell and the first logic state in the second spin-orbit torque magnetic tunnel junction cell. The read circuit arrangement may be configured to flow a first sense current through the first spin-orbit torque magnetic tunnel junction cell and a second sense current through the second spin-orbit torque magnetic tunnel junction cell for determining a logic state of the first spin-orbit torque magnetic tunnel junction cell and a logic state of the second spin-orbit torque magnetic tunnel junction cell.

Various embodiments may provide a method of operating a circuit arrangement. The method may include providing the circuit arrangement as described herein. The circuit arrangement may include a first spin-orbit torque magnetic tunnel junction cell having a reference terminal, a first electrode terminal, and a second electrode terminal. The circuit arrangement may also include a second spin-orbit torque magnetic tunnel junction cell having a reference terminal, a first electrode terminal, and a second electrode terminal. The circuit arrangement may additionally include a first driver circuit arrangement connected to the second electrode terminal of the first spin-orbit torque magnetic tunnel junction cell and the first electrode terminal of the second spin-orbit torque magnetic tunnel junction cell. The circuit arrangement may also include a second driver circuit arrangement connected to the first electrode terminal of the first spin-orbit torque magnetic tunnel junction cell and the second electrode terminal of the second spin-orbit torque magnetic tunnel junction cell. The circuit arrangement may further include a read circuit arrangement connected to the reference terminal of the first spin-orbit torque magnetic tunnel junction cell and the reference terminal of the second spin-orbit torque magnetic tunnel junction cell. The first driver circuit arrangement and the second driver circuit arrangement may be configured so that a first write current flowing from the first driver circuit arrangement to the second driver circuit arrangement generates a first logic state in the first spin-orbit torque magnetic tunnel junction cell and a second logic state in the second spin-orbit torque magnetic tunnel junction cell, and a second write current flowing from the second driver circuit arrangement to the first driver circuit arrangement generates the second logic state in the first spin-orbit torque magnetic tunnel junction cell and the first logic state in the second spin-orbit torque magnetic tunnel junction cell. The read circuit arrangement may be configured to flow a first sense current through the first spin-orbit torque magnetic tunnel junction cell and a second sense current through the second spin-orbit torque magnetic tunnel junction cell for determining a logic state of the first spin-orbit torque magnetic tunnel junction cell and a logic state of the second spin-orbit torque magnetic tunnel junction cell. The method may also include writing to the first spin-orbit torque magnetic tunnel junction cell and the second spin-orbit torque magnetic tunnel junction cell.

BRIEF DESCRIPTION OF THE DRAWINGS

The invention will be better understood with reference to the detailed description when considered in conjunction with the non-limiting examples and the accompanying drawings, in which:

FIG. 8A is a table showing the parameters used for the evaluation of the spin-orbit torque (SOT) switching of the spin-orbit torque magnetic tunneling junction (SOT MTJ) according to various embodiments.

FIG. 9A is a timing diagram the simulated input (D) and output (Q) waveforms together with the clock signal (CLK) and the power signal (Power) of the non-volatile flip-flop according to various embodiments.

FIG. 11A is a table comparing parallel writing according to various embodiments with conventional serial writing.

FIG. 11B is a table comparing two parallel writing schemes according to various embodiments with conventional serial writing.

DETAILED DESCRIPTION

Figure 1A:
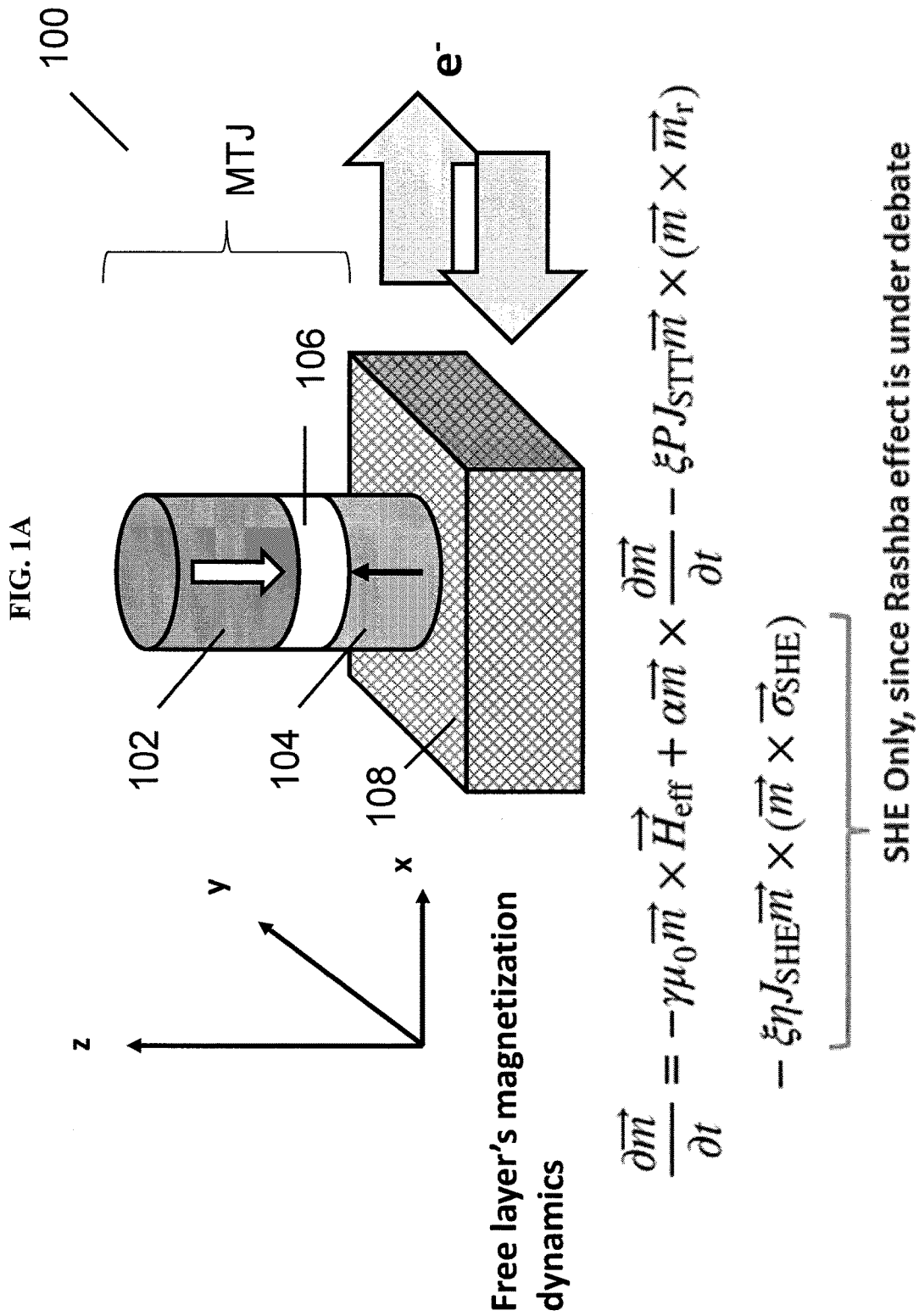
FIG. 1A is a schematic showing a perspective view of a spin-orbit torque magnetic tunneling junction (SOT MTJ) device.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or arrangements are analogously valid for the other methods or arrangements. Similarly, embodiments described in the context of a method are analogously valid for an arrangement, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

In various embodiments, a "circuit" may be understood as any kind of a logic implementing entity, which may be special purpose circuitry or a processor executing software stored in a memory, firmware, or any combination thereof. Thus, in various embodiments, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

In various embodiments, a first controlled electrode of a transistor may refer to the source and a second controlled electrode of the transistor may refer to the drain. In various alternate embodiments, the first controlled electrode of a transistor may refer to the drain and a second controlled electrode of the transistor may refer to the source. A control electrode of a transistor may refer to the gate. A transistor being "activated" or "switched on" on may refer to a state of the transistor in which a substantial current is allowed to flow between the first controlled electrode and the second controlled electrode. Conversely, the transistor being "deactivated" or "switched off" on may refer to a state of the transistor in which no current or an insubstantial current, i.e. subthreshold current, is allowed to flow between the first controlled electrode and the second controlled electrode.

The cell, device or arrangement as described herein may be operable in various orientations, and thus it should be understood that the terms "top", "bottom", etc., when used in the following description are used for convenience and to aid understanding of relative positions or directions, and not intended to limit the orientation of the cell, device or arrangement.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

For adoption of spin-orbit torque magnetic tunneling junction (SOT MTJ) into non-volatile flip-flops, the SOT-MTJs would need to be effectively configured for prompt data access and retrieval. Otherwise, the flip-flop would suffer from slower speed performance due to built-up of parasitic resistances. In addition, the layout of the SOT MTJs may need to be simplified for easy adoption for process integration and manufacturability.

FIG. 1A is a schematic showing a perspective view of a spin-orbit torque magnetic tunneling junction (SOT MTJ) device 100. The MTJ may include a hard magnetic layer 102 as a reference layer, and a soft magnetic layer 104 as a storage layer. The MTJ may include a tunneling barrier layer 106 between or sandwiched between the hard magnetic layer 102 and the soft magnetic layer 104. The magnetization of the layers 102, 104 may be oriented along a perpendicular direction (to the main surfaces of the layers 102, 104). The magnetization orientation of layer 102 may be perpendicular to the interface between layer 106 and layer 102, and the magnetization orientation of layer 104 may be perpendicular to the interface between layer 104 and layer 102. The device 100 may also include an electrode 108 (referred to as a spin-orbit torque (SOT) electrode) in contact with the MTJ. The MTJ may be above the electrode 108. The electrode 108 may be nearer to the storage layer 104 than the reference layer 102. Spin-orbit coupling effect may dominate when an electrical current of critical value flows through the electrode 108 which generates the spin current, thus allowing for the direct magnetic reversal of the storage layer 104. By directing the direction of flow in the SOT electrode 108, the magnetic orientation of the soft magnetic layer 104 may be controlled. To read-out the information stored in the SOT MTJ, a voltage (or current) may be applied across (or in) the MTJ and the resulting current (or voltage) may be sensed at the reference layer of the MTJ. The SOT device 100 may include three terminals.

Figure 1B:
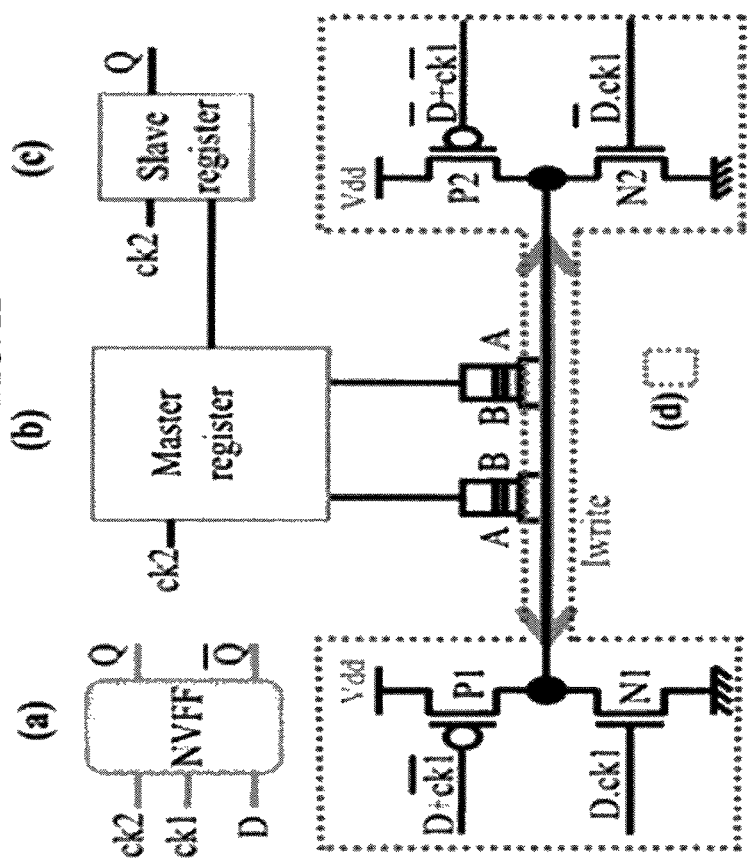
FIG. 1B is a conventional non-volatile flip-flop (NVFF) arrangement.

FIG. 1B is a conventional non-volatile flip-flop (NVFF) arrangement 150. This arrangement 150 has been reported in Kotb Jabeur et al. (IEEE Electron Device Letters, VOL. 35, NO. 3, March 2014). The terminals of the SOT devices would need to be specially configured in such an arrangement 150 (i.e. A-B to B-A as shown in FIG. 1B) to program the SOT devices in a complementary manner, which makes fabricating such a layout challenging.

Figure 2:
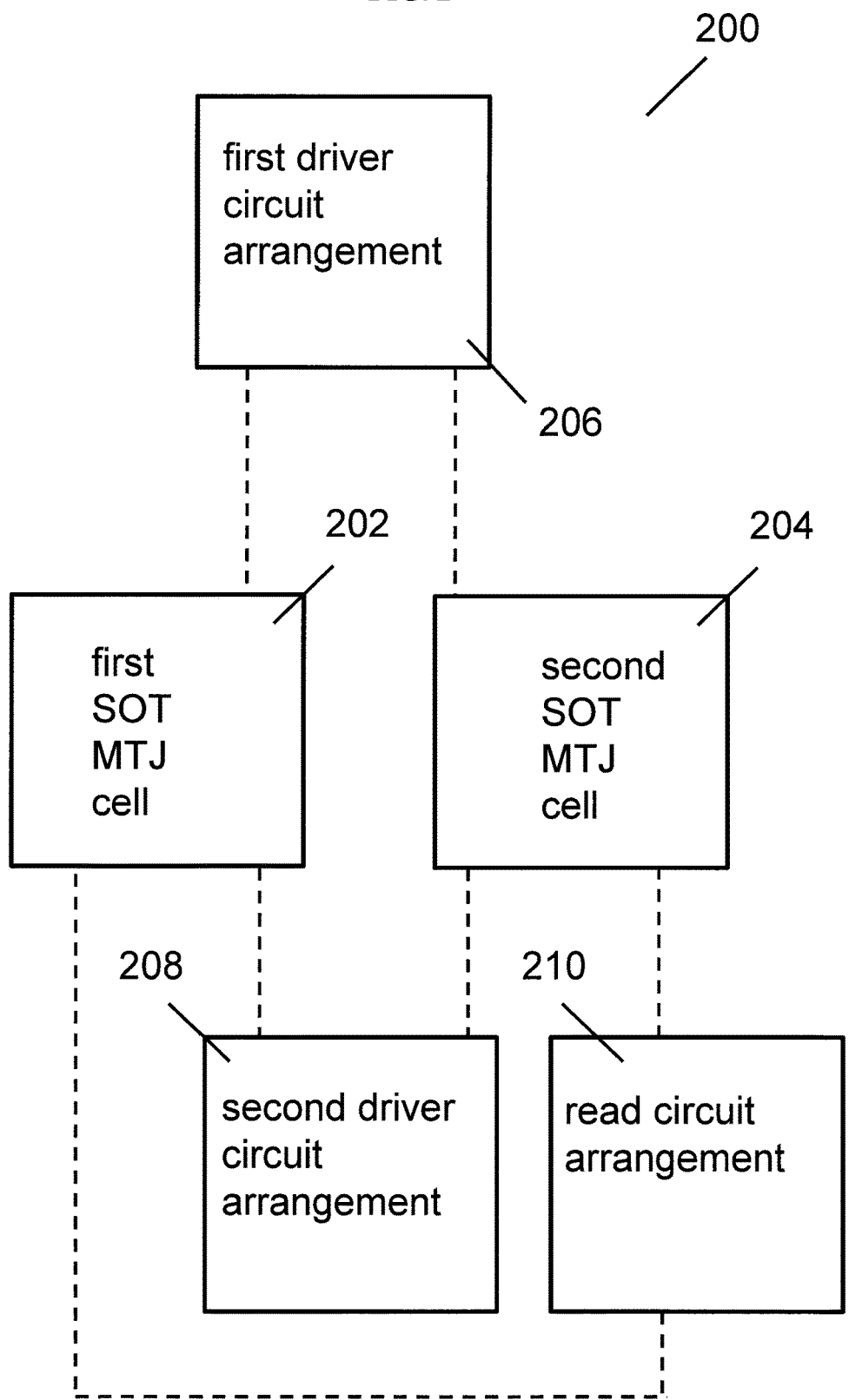
FIG. 2 shows schematic of a circuit arrangement according to various embodiments.

FIG. 2 shows schematic of a circuit arrangement 200 according to various embodiments. The circuit arrangement 200 may include a first spin-orbit torque magnetic tunnel junction cell 202 having a reference terminal, a first electrode terminal, and a second electrode terminal. The circuit arrangement 200 may also include a second spin-orbit torque magnetic tunnel junction cell 204 having a reference terminal, a first electrode terminal, and a second electrode terminal. The circuit arrangement 200 may additionally include a first driver circuit arrangement 206 connected to the second electrode terminal of the first spin-orbit torque magnetic tunnel junction cell 202 and the first electrode terminal of the second spin-orbit torque magnetic tunnel junction cell 204. The circuit arrangement 200 may also include a second driver circuit arrangement 204 connected to the first electrode terminal of the first spin-orbit torque magnetic tunnel junction cell 202 and the second electrode terminal of the second spin-orbit torque magnetic tunnel junction cell 204. The circuit arrangement 200 may further include a read circuit arrangement 210 connected to the reference terminal of the first spin-orbit torque magnetic tunnel junction cell 202 and the reference terminal of the second spin-orbit torque magnetic tunnel junction cell 204. The first driver circuit arrangement 206 and the second driver circuit arrangement 208 may be configured so that a first write current flowing from the first driver circuit arrangement 206 to the second driver circuit arrangement 208 generates a first logic state in the first spin-orbit torque magnetic tunnel junction cell 202 and a second logic state in the second spin-orbit torque magnetic tunnel junction cell 204, and a second write current flowing from the second driver circuit arrangement 208 to the first driver circuit arrangement 206 generates the second logic state in the first spin-orbit torque magnetic tunnel junction cell 202 and the first logic state in the second spin-orbit torque magnetic tunnel junction cell 204. The read circuit arrangement 200 may be configured to flow a first sense current through the first spin-orbit torque magnetic tunnel junction cell 202 and a second sense current through the second spin-orbit torque magnetic tunnel junction cell 204 for determining a logic state of the first spin-orbit torque magnetic tunnel junction cell 202 and a logic state of the second spin-orbit torque magnetic tunnel junction cell 204.

In other words, the circuit arrangement 200 may include the first spin-orbit torque magnetic tunnel junction cell 202 and the second spin-orbit torque magnetic tunnel junction cell 204 connected in parallel to each other between the first driver circuit arrangement 206 and the second driver circuit arrangement 208. Complementary logic states may be written in the first spin-orbit torque magnetic tunnel junction cell 202 and the second spin-orbit torque magnetic tunnel junction cell 204. The circuit arrangement 200 may include read circuit arrangement 210 coupled to the first spin-orbit torque magnetic tunnel junction cell 202 and the second spin-orbit torque magnetic tunnel junction cell 204 to read the logic states stored in the first spin-orbit torque magnetic tunnel junction cell 202 and the second spin-orbit torque magnetic tunnel junction cell 204.

Various embodiments may seek to address or mitigate the issues faced by conventional devices. Various embodiments may have faster performance and/or less complex layout for easy adoption for process integration and manufacturability.

In the current context, a first component "connected" to a second component may refer to the first component in electrical connection with the second component. In various embodiments, the first component may be in direct contact with the second component, or the first component may be in contact with the second component via one or more connecting electrical connections or interconnects.

In various embodiments, the first spin-orbit torque magnetic tunnel junction cell 202 may include a magnetic tunneling junction, and an electrode in contact with the magnetic tunneling junction. In various embodiments, the second spin-orbit torque magnetic tunnel junction cell 202 may include a magnetic tunneling junction, and an electrode in contact with the magnetic tunneling junction.

As mentioned earlier, each spin-orbit torque magnetic tunnel junction cell may include three terminals.

The first electrode terminal of the first spin-orbit torque magnetic tunnel junction cell 202 may be at a first end of the electrode, i.e. spin-orbit torque (SOT) electrode, of the first spin-orbit torque magnetic tunnel junction cell. The second electrode terminal of the first spin-orbit torque magnetic tunnel junction cell 202 may be at a second end of the electrode, i.e. spin-orbit torque (SOT) electrode, of the first spin-orbit torque magnetic tunnel junction cell 202. The first and second end may be opposite ends of the electrode.

The magnetic tunneling junction of the first spin-orbit torque magnetic tunnel junction cell 202 may include a reference layer having a fixed magnetization, a storage layer configured to switch between a first magnetization state and a second magnetization state, and a tunneling barrier separating the reference layer and the storage layer. The reference terminal of the first spin-orbit torque magnetic tunnel junction cell 202 may be at the reference layer of the magnetic tunneling junction of the first spin-orbit torque magnetic tunnel junction cell 202.

The first spin-orbit torque magnetic tunnel junction cell 202 may be configured so that the first logic state of the first spin-orbit torque magnetic tunnel junction is generated when the storage layer of the first spin-orbit torque magnetic tunnel junction cell is at the first magnetization state. Conversely, the first spin-orbit torque magnetic tunnel junction cell 202 may be configured so that the second logic state of the first spin-orbit torque magnetic tunnel junction cell 202 is generated when the storage layer of the first spin-orbit torque magnetic tunnel junction cell 202 is at the second magnetization state. The second magnetization state may be different from or may be opposite to the first magnetization state.

The first electrode terminal of the second spin-orbit torque magnetic tunnel junction cell 204 may be at a first end of the electrode of the second spin-orbit torque magnetic tunnel junction cell. The second electrode terminal of the second spin-orbit torque magnetic tunnel junction cell 204 may be at a second end of the electrode of the second spin-orbit torque magnetic tunnel junction cell 204. The first and second end may be opposite ends of the electrode.

The magnetic tunneling junction of the second spin-orbit torque magnetic tunnel junction cell 204 may include a reference layer having a fixed magnetization, a storage layer configured to switch between a first magnetization state and a second magnetization state, and a tunneling barrier separating the reference layer and the storage layer. The reference terminal of the second spin-orbit torque magnetic tunnel junction cell 204 may be at the reference layer of the magnetic tunneling junction of the second spin-orbit torque magnetic tunnel junction cell 204.

The second spin-orbit torque magnetic tunnel junction cell 204 may be configured so that the first logic state of the second spin-orbit torque magnetic tunnel junction 204 is generated when the storage layer of the second spin-orbit torque magnetic tunnel junction cell 204 is at the first magnetization state. The second magnetic tunneling junction of the second spin-orbit torque magnetic tunnel junction cell 204 may include a reference layer having a fixed magnetization, a storage layer configured to switch between a first magnetization state and a second magnetization state, and a tunneling barrier separating the reference layer and the storage layer.

The second spin-orbit torque magnetic tunnel junction cell 204 may be configured so that the first logic state of the second spin-orbit torque magnetic tunnel junction cell 204 is generated when the storage layer of the second spin-orbit torque magnetic tunnel junction cell 204 is at the first magnetization state. Conversely, the second spin-orbit torque magnetic tunnel junction cell 204 may be configured so that the second logic state of the second spin-orbit torque magnetic tunnel junction cell is generated when the storage layer of the second spin-orbit torque magnetic tunnel junction cell 204 is at the second magnetization state.

The generation of the first logic state or the second logic state in the spin-orbit torque magnetic tunnel junction cells 202, 204 by the first write current or the second write current may be based on the SOT effect. The first write current and the second write current may be referred to as SOT currents.

In various embodiments, the read circuit arrangement 210 may include a differential sense amplifier. The differential sense amplifier may include a first input connected to the reference terminal of the first spin-orbit torque magnetic tunnel junction cell 202. The differential sense amplifier may also include a second input connected to the reference terminal of the second spin-orbit torque magnetic tunnel junction cell 204.

The differential sense amplifier may be configured to generate an output (which may be referred to as Q) based on the determination of the logic state of the first spin-orbit torque magnetic tunnel junction cell 202 and the logic state of the second spin-orbit torque magnetic tunnel junction cell 204. The differential sense amplifier may be configured to generate a further output. The further output (which may be referred to as $Q_b$) may be complementary or opposite to the output.

The first driver circuit arrangement 206 may be configured to receive a clock signal and a first input (which may be referred to as D). The second driver circuit arrangement 208 configured to receive a clock signal and a second input (which may be referred to as $D_b$). The clock signal provided to the first driver circuit arrangement 206 and the clock signal provided to second driver circuit arrangement 208 may be the same clock signal or may be synchronized clock signals. The clock signal(s) may synchronize the first driver circuit arrangement 206 and the second driver circuit arrangement 208. The clock signal or the synchronized clock signals may be referred to as CLK. The first input may be a voltage or a current. Similarly, the second input may be a voltage or a current.

The different sense amplifier may be configured to receive a further clock signal, which may be opposite or complementary to the clock signal. The further clock signal may be referred to as $\overline{\text{CLK}}$.

The circuit arrangement may be or may include a non-volatile flip-flop.

The first input and the second input may be complementary or opposite to each other. In other words, when the first input is "0" or "low" state, the second input may be "1" or "high" state. When the first input is "1" or "high" state, the second input may be "0" or "low" state.

When the first input (D) is in "0" or "low" state and the second input ($D_b$) is in "1" or "high" state, the output (Q) may be in the "0" or "low" state. Conversely, when the first input (D) is in "1" or "high" state and the second input ($D_b$) is in "0" or "low" state, the output (Q) may be in the "1" or "high" state.

In various embodiments, the first driver circuit arrangement 206 may be configured to generate a first voltage based on the clock signal, and the first input. The second driver circuit arrangement 208 may be configured to generate a second voltage based on the clock signal, and the second input. The first write current flows from the first driver circuit arrangement 206 to the second driver circuit arrangement 208 when the first voltage is higher than the second voltage. Conversely, the second write current may flow from the second driver circuit arrangement to the first driver circuit arrangement when the second voltage is higher than the first voltage.

In various other embodiments, the first driver circuit arrangement 206 may be configured to generate the first write current based on the clock signal, and the first input. The second driver circuit arrangement 208 may be configured to generate the second write current based on the clock signal, and the second input.

In various embodiments, the circuit arrangement 200 may further include a third driver circuit arrangement.

The third driver circuit arrangement may include a first portion connected to the reference terminal of the first spin-orbit torque magnetic tunnel junction cell 202, and a second portion connected to the reference terminal of the second spin-orbit torque magnetic tunnel junction cell 204.

The third driver circuit arrangement may, with the first driver circuit arrangement 202 and/or the second driver circuit arrangement 204, generate the first logic state or the second logic state in the spin-orbit torque magnetic tunnel junction cells 202, 204 using writing currents based on the spin-transfer torque (STT) effect.

In various embodiments, a voltage may be applied to the first portion of the third driver circuit arrangement may be substantially equal to the voltage applied to the second portion of the third driver circuit arrangement.

In various embodiments, when the first write current, i.e. SOT current, flowing from the first driver circuit arrangement 206 to the second driver circuit arrangement 208 (due to the first voltage higher than the second voltage) generates a first logic state in the first spin-orbit torque magnetic tunnel junction cell 202 and a second logic state in the second spin-orbit torque magnetic tunnel junction cell 204, STT current(s) may flow from the third driver circuit arrangement to the second driver circuit arrangement 208 (due to the voltage applied to the third driver circuit arrangement higher than the second voltage) to help generate the first logic state in the first spin-orbit torque magnetic tunnel junction cell 202 and the second logic state in the second spin-orbit torque magnetic tunnel junction cell 204. For instance, a first STT current may flow from the first portion of the third driver circuit arrangement through the MTJ of the first spin-orbit torque magnetic tunnel junction cell 202 and the SOT electrode of the first spin-orbit torque magnetic tunnel junction cell 202 to the second driver circuit arrangement 208 to generate the first logic state in the first spin-orbit torque magnetic tunnel junction cell 202. A second STT current may flow from the second portion of the third driver circuit arrangement through the MTJ of the second spin-orbit torque magnetic tunnel junction cell 204 and the SOT electrode of the second spin-orbit torque magnetic tunnel junction cell 204 to the second driver circuit arrangement 208 to generate the second logic state in the second spin-orbit torque magnetic tunnel junction cell 204.

In various embodiments, when the second write current, i.e. SOT current, flowing from the second driver circuit arrangement 208 to the first driver circuit arrangement 206 (due to the second voltage higher than the first voltage) generates a second logic state in the first spin-orbit torque magnetic tunnel junction cell 202 and a first logic state in the second spin-orbit torque magnetic tunnel junction cell 204, STT current(s) may flow from the third driver circuit arrangement to the first driver circuit arrangement 206 (due to the voltage applied to the third driver circuit arrangement higher than the first voltage) to help generate the second logic state in the first spin-orbit torque magnetic tunnel junction cell 202 and the first logic state in the second spin-orbit torque magnetic tunnel junction cell 204.

In various embodiments, a voltage may be applied to the first portion of the third driver circuit arrangement may be substantially different to the voltage applied to the second portion of the third driver circuit arrangement. The voltage applied to the first portion of the third circuit arrangement may be of a first polarity, and the voltage applied to the second portion of the third circuit arrangement may be of a second polarity opposite the first polarity.

In various embodiments, when the first write current, i.e. SOT current, flowing from the first driver circuit arrangement 206 to the second driver circuit arrangement 208 (due to the first voltage higher than the second voltage) generates a first logic state in the first spin-orbit torque magnetic tunnel junction cell 202 and a second logic state in the second spin-orbit torque magnetic tunnel junction cell 204, a first STT current may flow from the first driver circuit arrangement 206 to the first portion of the third driver circuit arrangement (due to the first voltage higher than the voltage applied to the first portion of the third driver circuit arrangement) to help generate the first logic state in the first spin-orbit torque magnetic tunnel junction cell 202, and a second STT current may flow from the second portion of the third driver circuit arrangement to the second driver circuit arrangement (due to the voltage applied to the second portion of the third driver circuit arrangement higher than the second voltage) to generate the second logic state in the second spin-orbit torque magnetic tunnel junction cell 204.

Conversely, when the second write current, i.e. SOT current, flowing from the second driver circuit arrangement 208 to the first driver circuit arrangement 206 (due to the second voltage higher than the first voltage) generates a second logic state in the first spin-orbit torque magnetic tunnel junction cell 202 and a first logic state in the second spin-orbit torque magnetic tunnel junction cell 204, a third STT current may flow from the first portion of the third driver circuit arrangement to the first driver circuit arrangement (due to the voltage applied to the first portion of the third driver circuit arrangement higher than the first voltage) to help generate the second logic state in the first spin-orbit torque magnetic tunnel junction cell 202, and a fourth STT current may flow from the second driver circuit arrangement to the second portion of the third driver circuit arrangement to generate the first logic state in the second spin-orbit torque magnetic tunnel junction cell 204.

Figure 3:
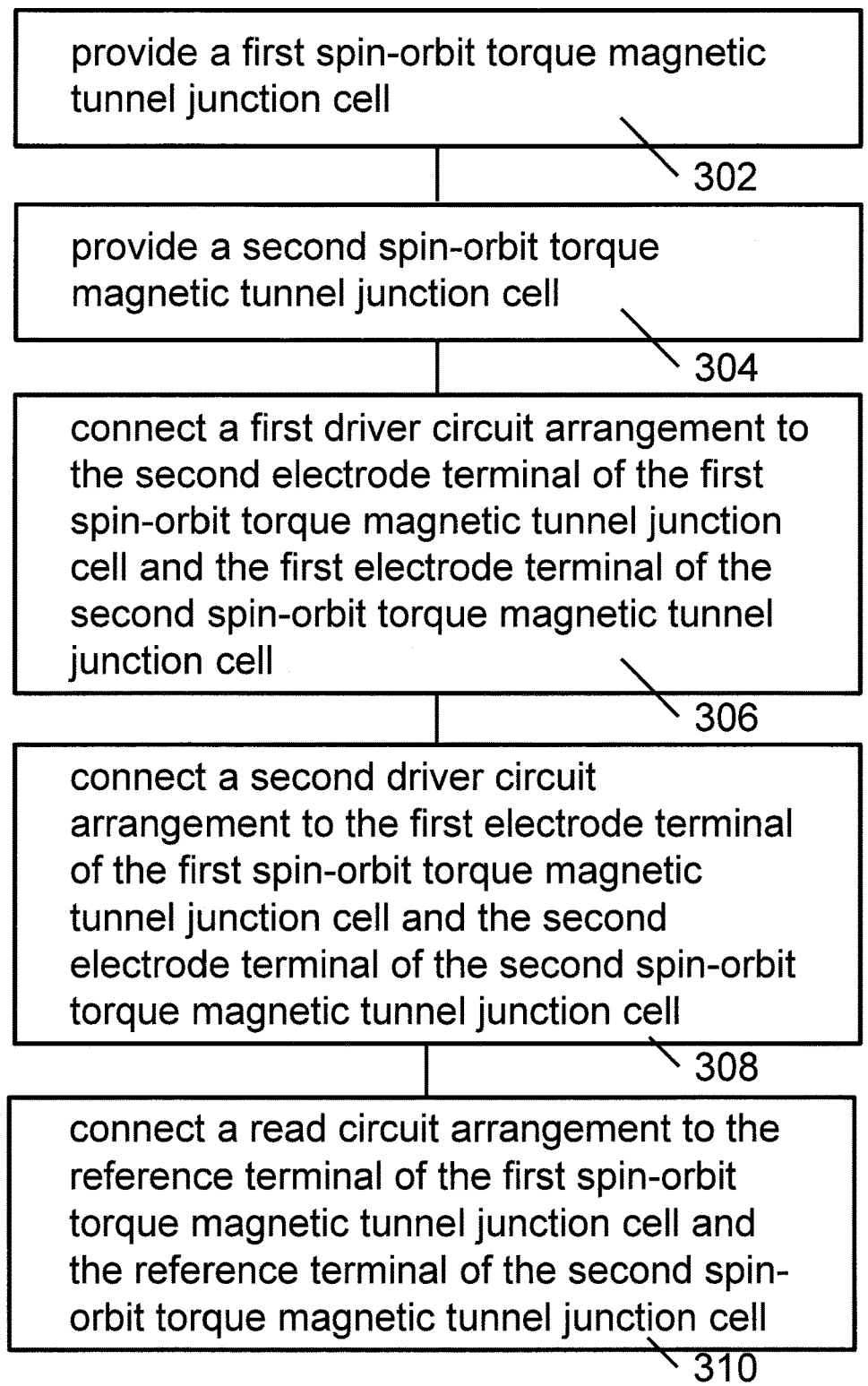
FIG. 3 is a schematic showing a method of forming a circuit arrangement according to various embodiments.

FIG. 3 is a schematic 300 showing a method of forming a circuit arrangement according to various embodiments. The method may include, in 302, providing a first spin-orbit torque magnetic tunnel junction cell having a reference terminal, a first electrode terminal, and a second electrode terminal. The method may also include, in 304, providing a second spin-orbit torque magnetic tunnel junction cell having a reference terminal, a first electrode terminal, and a second electrode terminal. The method may further include, in 306, connecting a first driver circuit arrangement to the second electrode terminal of the first spin-orbit torque magnetic tunnel junction cell and the first electrode terminal of the second spin-orbit torque magnetic tunnel junction cell. The method may additionally include, in 308, connecting a second driver circuit arrangement to the first electrode terminal of the first spin-orbit torque magnetic tunnel junction cell and the second electrode terminal of the second spin-orbit torque magnetic tunnel junction cell. The method may also include, in 310, connecting a read circuit arrangement to the reference terminal of the first spin-orbit torque magnetic tunnel junction cell and the reference terminal of the second spin-orbit torque magnetic tunnel junction cell. The first driver circuit arrangement and the second driver circuit arrangement may be configured so that a first write current flowing from the first driver circuit arrangement to the second driver circuit arrangement generates a first logic state in the first spin-orbit torque magnetic tunnel junction cell and a second logic state in the second spin-orbit torque magnetic tunnel junction cell, and a second write current flowing from the second driver circuit arrangement to the first driver circuit arrangement generates the second logic state in the first spin-orbit torque magnetic tunnel junction cell and the first logic state in the second spin-orbit torque magnetic tunnel junction cell. The read circuit arrangement may be configured to flow a first sense current through the first spin-orbit torque magnetic tunnel junction cell and a second sense current through the second spin-orbit torque magnetic tunnel junction cell for determining a logic state of the first spin-orbit torque magnetic tunnel junction cell and a logic state of the second spin-orbit torque magnetic tunnel junction cell.

In other words, the method may include forming a circuit arrangement as described herein. The method may include connecting the first spin-orbit torque magnetic tunnel junction cell, the second spin-orbit torque magnetic tunnel junction cell, the first driver arrangement, the second driver arrangement and the read circuit arrangement.

Figure 4:
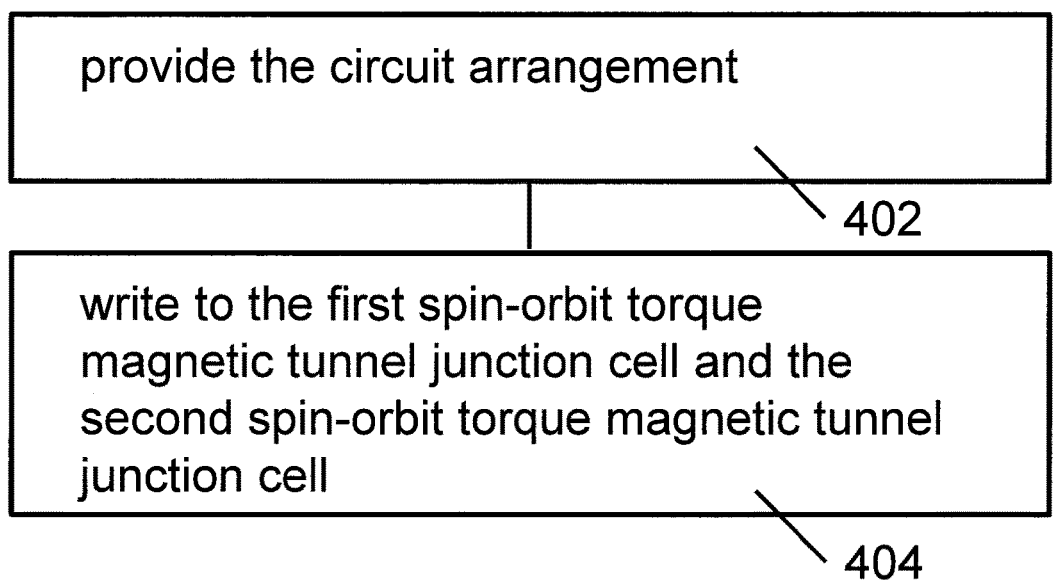
FIG. 4 is a schematic showing a method of operating a circuit arrangement according to various embodiments.

FIG. 4 is a schematic 400 showing a method of operating a circuit arrangement according to various embodiments. The method may include, in 402, providing the circuit arrangement as described herein. The circuit arrangement may include a first spin-orbit torque magnetic tunnel junction cell having a reference terminal, a first electrode terminal, and a second electrode terminal. The circuit arrangement may also include a second spin-orbit torque magnetic tunnel junction cell having a reference terminal, a first electrode terminal, and a second electrode terminal. The circuit arrangement may additionally include a first driver circuit arrangement connected to the second electrode terminal of the first spin-orbit torque magnetic tunnel junction cell and the first electrode terminal of the second spin-orbit torque magnetic tunnel junction cell. The circuit arrangement may also include a second driver circuit arrangement connected to the first electrode terminal of the first spin-orbit torque magnetic tunnel junction cell and the second electrode terminal of the second spin-orbit torque magnetic tunnel junction cell. The circuit arrangement may further include a read circuit arrangement connected to the reference terminal of the first spin-orbit torque magnetic tunnel junction cell and the reference terminal of the second spin-orbit torque magnetic tunnel junction cell. The first driver circuit arrangement and the second driver circuit arrangement may be configured so that a first write current flowing from the first driver circuit arrangement to the second driver circuit arrangement generates a first logic state in the first spin-orbit torque magnetic tunnel junction cell and a second logic state in the second spin-orbit torque magnetic tunnel junction cell, and a second write current flowing from the second driver circuit arrangement to the first driver circuit arrangement generates the second logic state in the first spin-orbit torque magnetic tunnel junction cell and the first logic state in the second spin-orbit torque magnetic tunnel junction cell. The read circuit arrangement may be configured to flow a first sense current through the first spin-orbit torque magnetic tunnel junction cell and a second sense current through the second spin-orbit torque magnetic tunnel junction cell for determining a logic state of the first spin-orbit torque magnetic tunnel junction cell and a logic state of the second spin-orbit torque magnetic tunnel junction cell. The method may include, in 404, writing to the first spin-orbit torque magnetic tunnel junction cell and the second spin-orbit torque magnetic tunnel junction cell.

In other words, a method of operating a circuit arrangement may include providing and writing to the circuit arrangement.

Writing to the first spin-orbit torque magnetic tunnel junction cell and the second spin-orbit torque magnetic tunnel junction cell may include providing a clock signal to the first driver circuit arrangement and the second driver circuit arrangement. In various embodiments, writing to the first spin-orbit torque magnetic tunnel junction cell and the second spin-orbit torque magnetic tunnel junction cell may include providing a first clock signal to the to the first driver circuit arrangement, and providing a second clock signal to the to the second driver circuit arrangement, the second clock signal synchronized to the first clock signal.

Writing to the first spin-orbit torque magnetic tunnel junction cell and the second spin-orbit torque magnetic tunnel junction cell may further include providing a first input to the first driver circuit arrangement; and providing a second input to the second driver circuit arrangement. The first input may be opposite or complementary to the second input.

The method may further include determining the logic state of the first spin-orbit torque magnetic tunnel junction cell and the logic state of the second spin-orbit torque magnetic tunnel junction cell.

Determining the logic state of the first spin-orbit torque magnetic tunnel junction cell and the logic state of the second spin-orbit torque magnetic tunnel junction cell may include connecting the first electrode terminal and second electrode terminal of the first spin-orbit torque magnetic tunnel junction cell to ground or to a reference voltage; connecting the first electrode terminal and second electrode terminal of the second spin-orbit torque magnetic tunnel junction cell to ground or to the reference voltage; and providing the first sense current through the first spin-orbit torque magnetic tunnel junction cell and a second sense current through the second spin-orbit torque magnetic tunnel junction cell to determine the logic state of the first spin-orbit torque magnetic tunnel junction cell and the logic state of the second spin-orbit torque magnetic tunnel junction cell.

Determining the logic state of the first spin-orbit torque magnetic tunnel junction cell may refer to or may include determining the logic state stored in the first spin-orbit torque magnetic tunnel junction cell. Likewise, determining the logic state of the second spin-orbit torque magnetic tunnel junction cell may refer to or may include determining the logic state stored in the second spin-orbit torque magnetic tunnel junction cell.

Determining the logic state of the first spin-orbit torque magnetic tunnel junction cell may include providing the logic state of the first spin-orbit torque magnetic tunnel junction cell to a first input of a differential sense amplifier and providing the logic state of the second spin-orbit torque magnetic tunnel junction cell to a second input of the differential sense amplifier.

The differential sense amplifier may be configured to generate an output based on the determination of the logic state of the first spin-orbit torque magnetic tunnel junction cell and the logic state of the second spin-orbit torque magnetic tunnel junction cell. The differential sense amplifier may be configured to generate a further output. The further output (which may be referred to as $Q_b$) may be complementary or opposite to the output.

The method may include determining or reading the output and/or the further output.

Figure 5A:
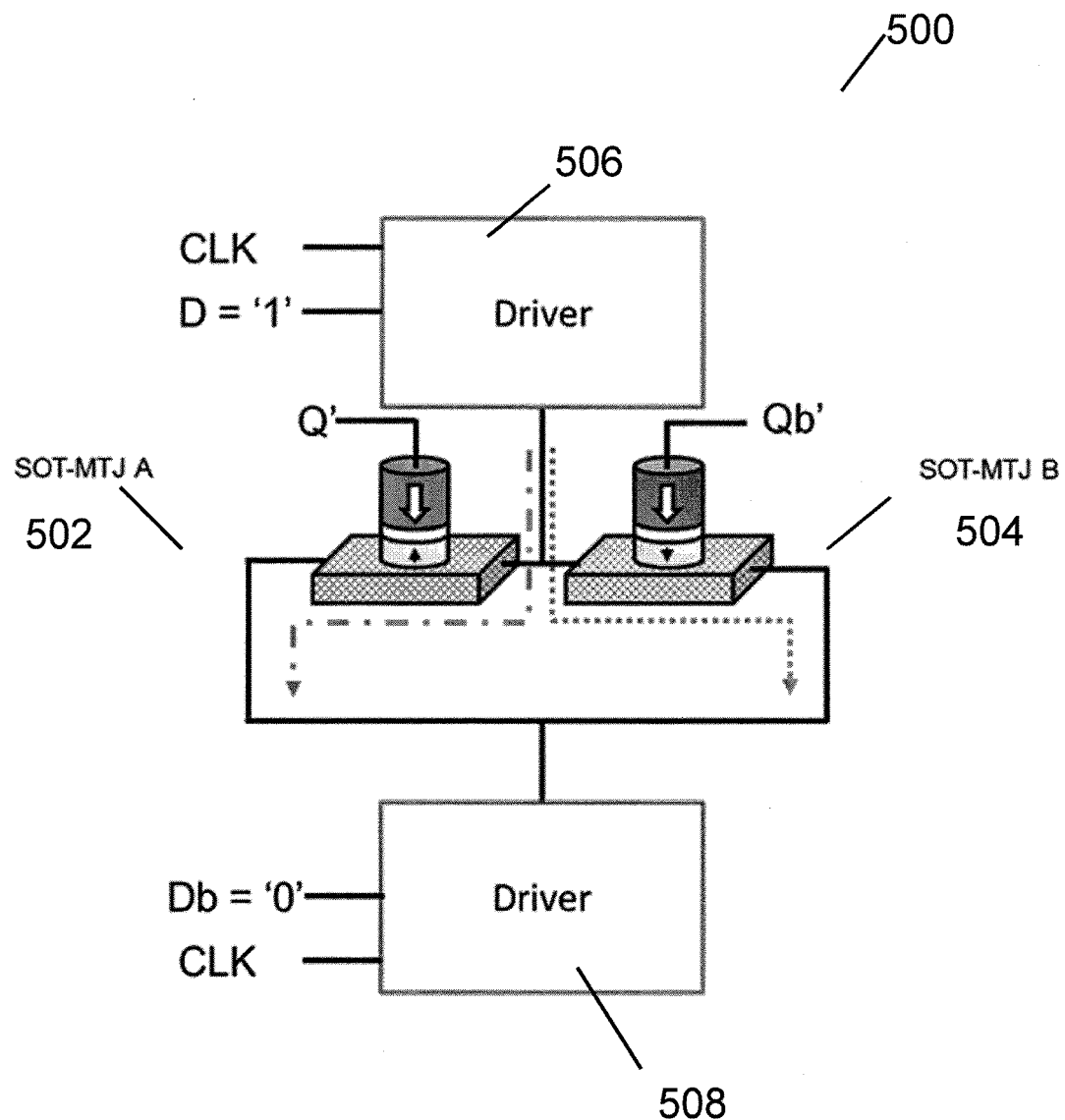
FIG. 5A is a schematic showing a circuit arrangement according to various embodiments in a "1" state.

FIG. 5A is a schematic showing a circuit arrangement 500 according to various embodiments in a "1" state. The circuit arrangement 500 may be a spin-orbit-torque (SOT) non-volatile flip-flop. The circuit arrangement may include a first spin-orbit torque magnetic tunnel junction cell 502, and a second spin-orbit torque magnetic tunnel junction cell 504. The first spin-orbit torque magnetic tunnel junction cell 502, and the second spin-orbit torque magnetic tunnel junction cell 504 may be arranged or placed adjacent to or neighboring each other.

In order for the complementary programming of the respective MTJs, i.e. "0" and "1" and vice versa, a first driver circuit arrangement (which may be also referred to as a first programming driver) may be connected to the first junction of the two SOT electrodes, whereas the second junction of the SOT electrode further away may be connected to a second driver circuit arrangement (which may be referred to as a second programming driver). These programming drivers may serve as either a source or a sink, as configured by a digital signal in correlation with the input data.

As an illustration, to store a digital '1' from or based on the input "D", the complementary cells 502, 504 may need to be respectively programmed as "1" and "0". As shown in FIG. 5A, the input signal D="1", which may configure the first programming driver 506 as a source and the second programming driver 508 as a sink. In various embodiments, the first writing current flowing from the first programming driver 506 may be split into sub-currents, with each sub-current flowing through a respective SOT electrode before joining each other to flow to the second programming driver 508, as the loop is closed from the first driver 506 to the second driver 508. As depicted in FIG. 5A, the direction of sub-current flow through the SOT electrode in cell 502 and the direction of sub-current flow through the SOT electrode in cell 504 may be opposite and away from each other. This may result in the magnetizations (of the storage layers) in the respective MTJs to switch to opposing logic states in opposing directions (high resistance state for MTJ A in cell 502 and low resistance state for MTJ B in cell 504). This may consequently leads to the two MTJs having opposing magnetic states of digital "1" and "0", respectively.

Figure 5B:
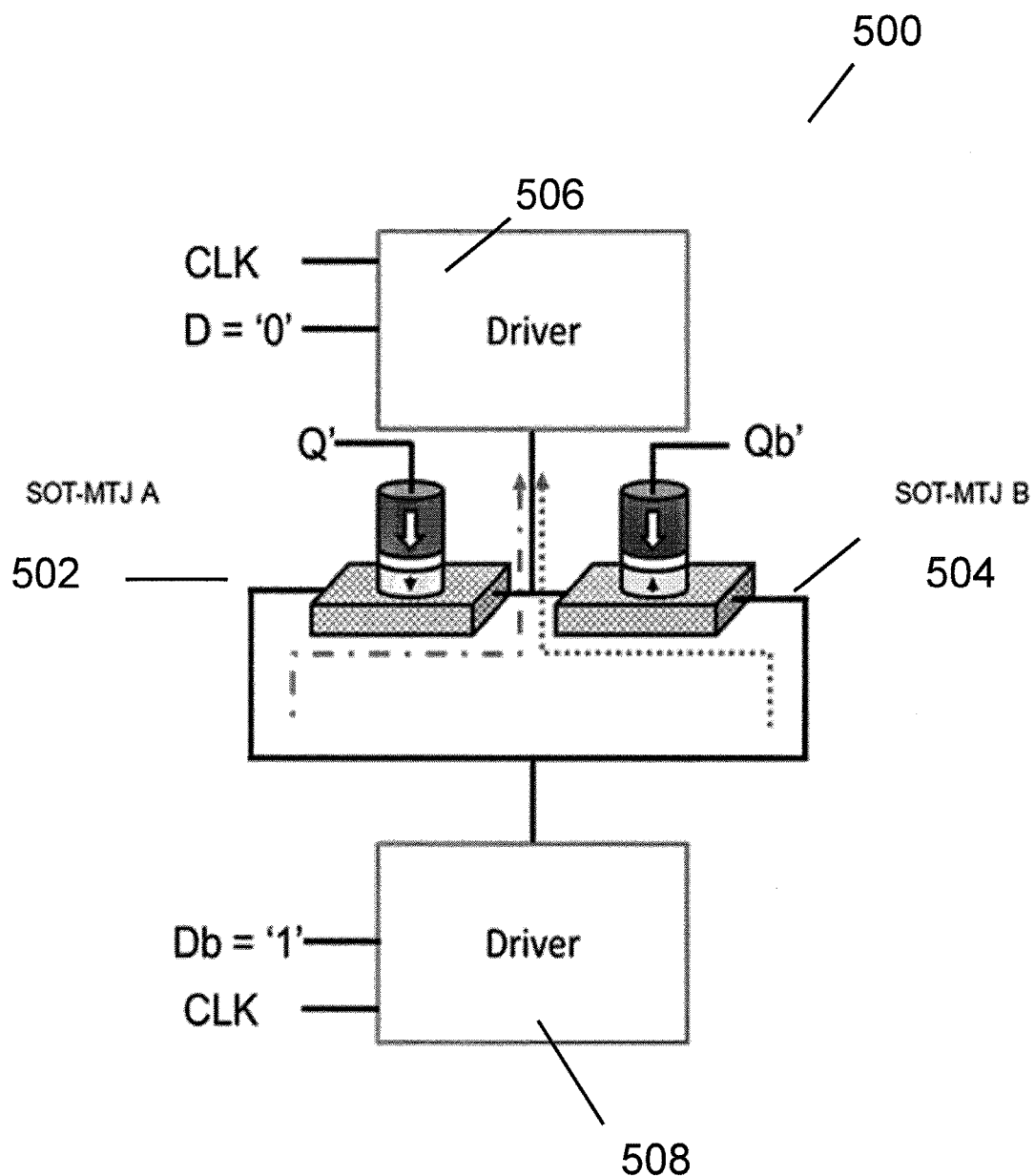
FIG. 5B is a schematic showing the circuit arrangement according to various embodiments in a "0" state.

FIG. 5B is a schematic showing the circuit arrangement 500 according to various embodiments in a "0" state. Similarly, in order to store a digital '0' in the complementary cells, the input signal is D="0", as depicted in FIG. 5B. Consequently, the first driver 506 may be set as a sink and the second driver 508 may be set as a source. A second writing current may flow from the second driver 508, splitting into two sub-currents, with each sub-current flowing through a respective SOT electrode, before joining each other to flow to the sink at the first driver 506. The directions of sub-current flows along the two SOT electrodes may be opposing and towards each other, which may result in the reversal of the magnetizations (in the storage layers) of the MTJs of cells (i.e. switch to low resistance state for MTJ A in cell 502 and high resistance state for MTJ B in cell 504). This may consequently lead to two MTJs having opposing magnetic states of digital "0" and "1", respectively. The read circuit arrangement is not shown in FIGS. 5A and 5B.

Figure 5C:
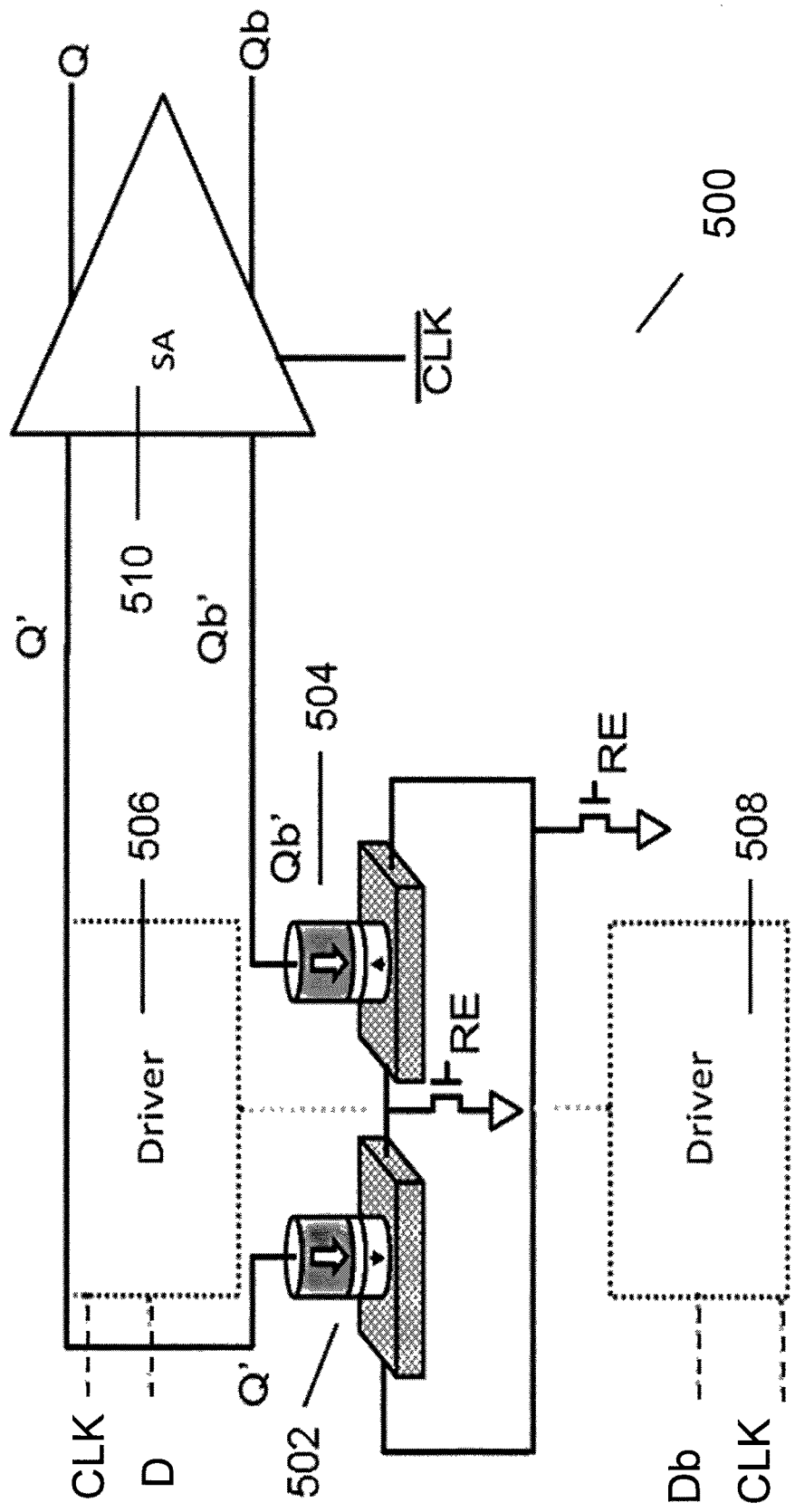
FIG. 5C is a schematic showing the circuit arrangement with the read circuit arrangement shown according to various embodiments.

FIG. 5C is a schematic showing the circuit arrangement 500 with the read circuit arrangement 510 shown according to various embodiments. Latch based differential sensing scheme may be adopted for retrieving the information stored in the complementary SOT-MTJS as shown in FIG. 5C. The read circuit arrangement 510 may include a differential sense amplifier.

During the logic '0' clock phase, the reference node of the MTJs in cells 502, 504 are precharged to the required value, upon receiving a read enable "RE" signal which is generated internally. The clock signal 'CLK' may be used as a reference.

The "RE" may activate the closing of the paths towards ground and may allow discharge of the reference node via the MTJ and SOT electrodes. In other words, the two terminals in each SOT electrode in respective cell 502, 504 may be grounded. The circuit arrangement 500 may include the differential sense amplifier 510 connected to the reference terminals of MTJs in cells 502, 504. The difference in voltages between the reference terminal of cell 502 and the reference terminal of cell 504 may sensed or determined, amplified by amplifier 510, and outputted as binary outputs "Q" and "$Q_b$". As shown in FIG. 5C, a complementary clock signal $\overline{CLK}$ may be provided to the amplifier 510.

Figure 6:
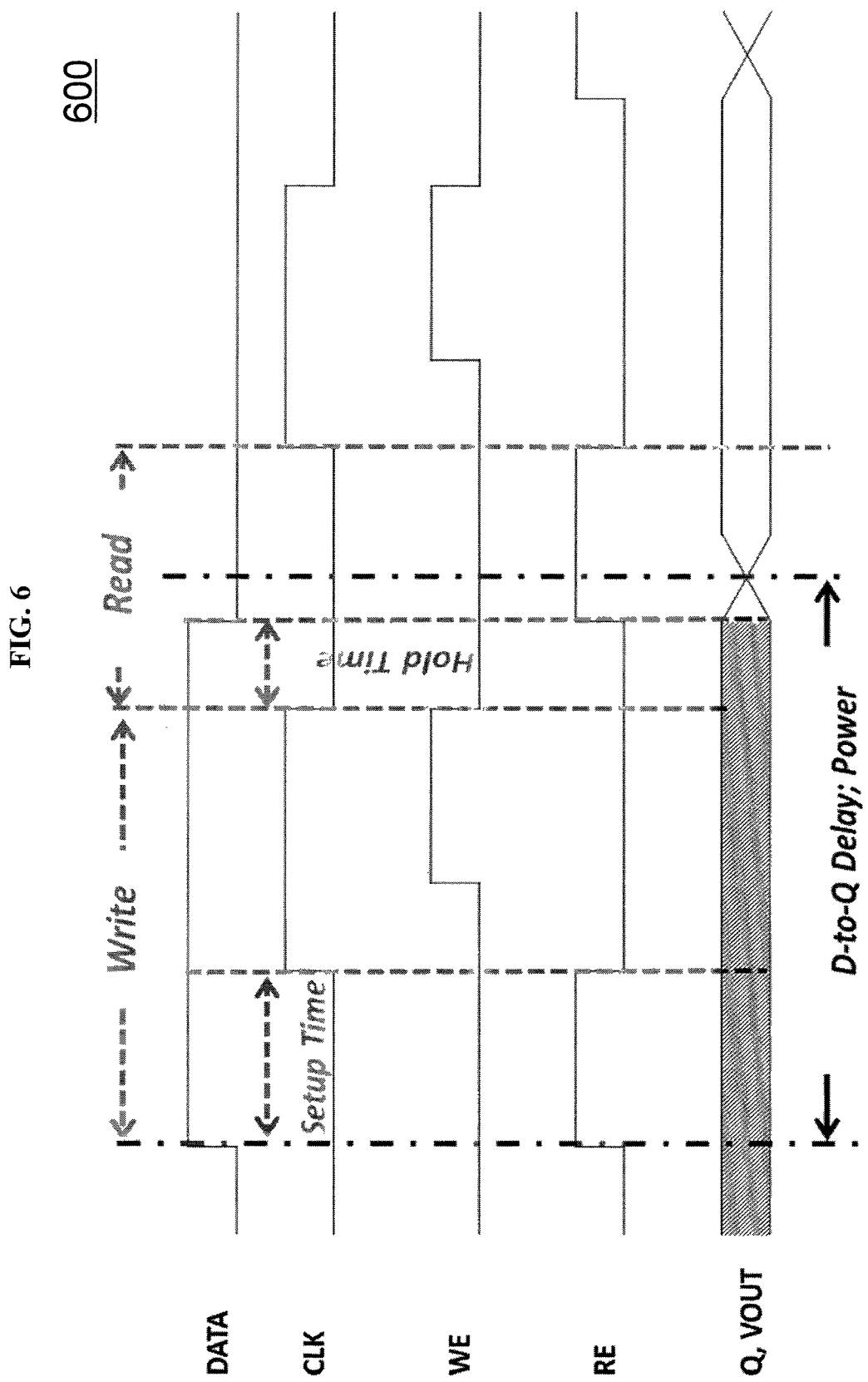
FIG. 6 is a timing diagram for the operation of a non-volatile flip-flop based on spin-orbit torque effect according to various embodiments.

FIG. 6 is a timing diagram 600 for the operation of a non-volatile flip-flop based on spin-orbit torque effect according to various embodiments. Data "D" and Clock "CLK" are the input signals, and Output "Q" is the output signal. Write Enable "WE" and Read Enable "RE" are the internal control signals. The write/store operation may be triggered by 'WE' signal, generated based on rising edge of the 'CLK' edge, available data signal and the previous data. This may be required to avoid unnecessary write to cell, which may be beneficial in improving the dynamic power and cell lifetime. The falling edge of the CLK signal may trigger the reading phase of stored value, and may pre-charge the reference node. The 'RE' as generated with reference to the 'CLK' signal may activate and close the path towards ground, which may lead to discharging via MTJ and SOT. A voltage difference between the reference terminals of the two different cells may be determined. This difference may be sensed by a back-to-back connected positive feedback sensing network. Inverters and buffers may be inserted along the path to data 'Q' output, to return the logic to a full voltage level.

Figure 7:
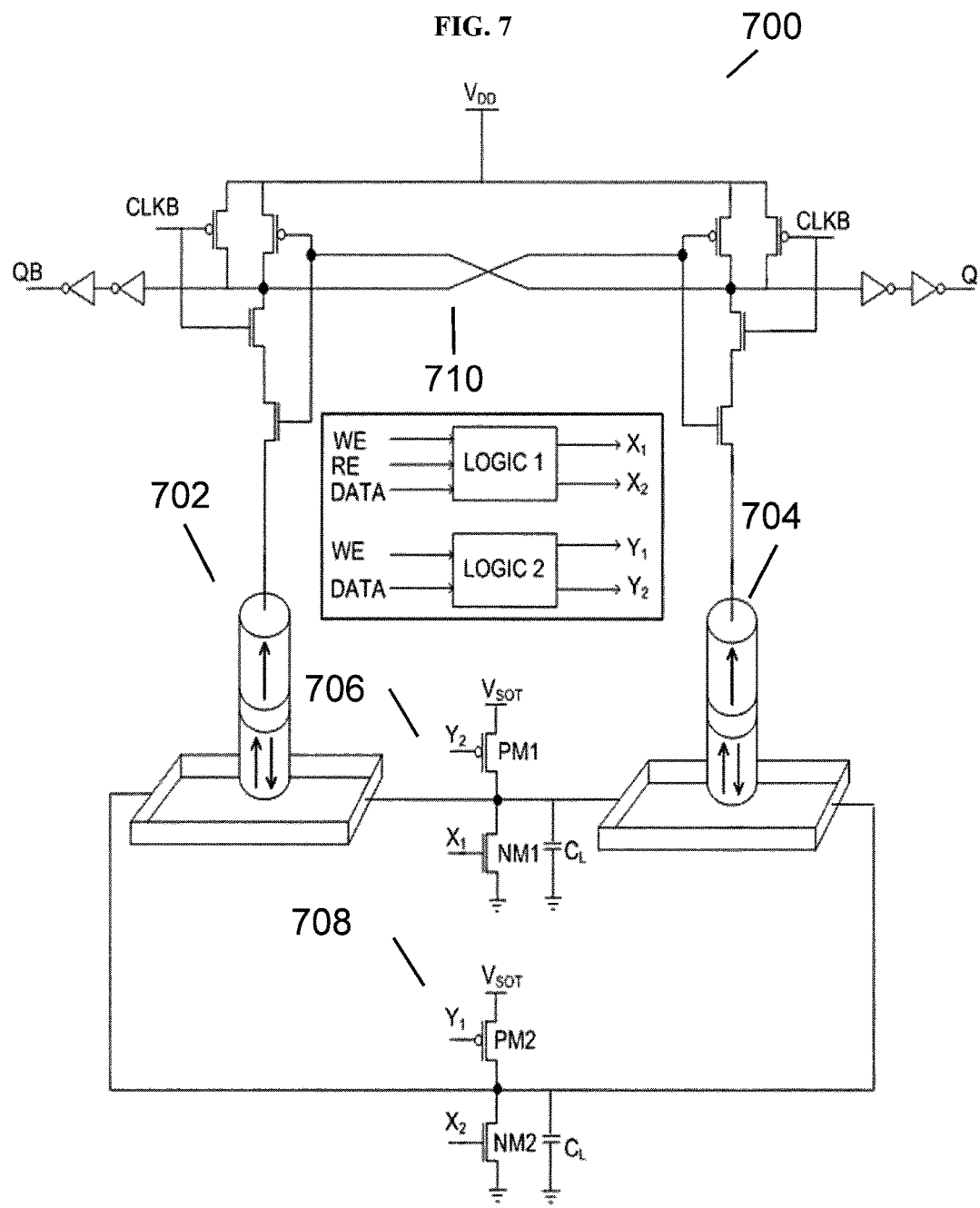
FIG. 7 is a schematic of a non-volatile flip-flop based on spin-orbit torque effect according to various embodiments.

FIG. 7 is a schematic of a non-volatile flip-flop 700 based on spin-orbit torque effect according to various embodiments. In various embodiments, identical SOT-MTJs 702, 704 may be designed to be layout adjacent to one another. This may help to minimize variation of the MTJs as they are placed close to one another. In addition, the SOT electrodes may be in parallel to each other, leading to lowering of the delay. As a result, better speed performance may be achieved.

As shown in FIG. 7, the first driver circuit arrangement 706 may include a re-channel metal oxide field effect transistor $NM_1$ and a p-channel metal oxide field effect transistor $PM_1$. A first controlled electrode of $PM_1$ may be connected to reference voltage $V_{SOT}$, while a second controlled electrode of $PM_1$ may be connected to the SOT electrodes of cells 702, 704. The control electrode of $PM_1$ may be configured to receive internal control signal $Y_2$. A first controlled electrode of $NM_1$ may be connected to the SOT electrodes of cells 702, 704 (and the second controlled electrode of $PM_1$), while a second controlled electrode of $NM_1$ may be connected to ground (0 V). The control electrode of $NM_1$ may be configured to receive internal control signal $X_1$.

The second driver circuit arrangement 708 may include a n-channel metal oxide field effect transistor $NM_2$ and a p-channel metal oxide field effect transistor $PM_2$. A first controlled electrode of $PM_2$ may be connected to reference voltage $V_{SOT}$, while a second controlled electrode of $PM_2$ may be connected to the SOT electrodes of cells 702, 704. The control electrode of $PM_2$ may be configured to receive internal control signal $Y_1$. A first controlled electrode of $NM_2$ may be connected to the SOT electrodes of cells 702, 704 (and the second controlled electrode of $PM_2$), while a second controlled electrode of $NM_2$ may be connected to ground (0 V). The control electrode of $NM_2$ may be configured to receive internal control signal $X_2$.

The inset of FIG. 7 is symbolic representation of logic involved for generating internal controls signals to control the write/read drivers. A pre-charging based write/read scheme may be adopted with controlled delay to improve the general read-write operation of the non-volatile flip-flop. Signals "$X_1$" and "$X_2$" may be second-level internal signals used for controlling the nMOS transistors $NM_1$, $NM_2$ respectively, and signals "$Y_1$" and "$Y_2$" may be second-level internal signals used for controlling the pMOS transistors $PM_2$, $PM_1$ respectively. In a first instance, signal $Y_2$ may activate (i.e. switch on) $PM_1$ to set the first driver circuit arrangement 706 to $V_{SOT}$, and signal $X_2$ may activate $NM_2$ to set the second driver circuit arrangement 708 to ground, so that a first writing current may flow from the first driver circuit arrangement 706 to the second driver circuit arrangement 708. In a second instance, signal $Y_1$ may activate (i.e. switch on) $PM_2$ to set the second driver circuit arrangement 708 to $V_{SOT}$, and signal $X_1$ may activate $NM_1$ to set the first driver circuit arrangement 706 to ground, so that a second writing current may flow from the second driver circuit arrangement 708 to the first driver circuit arrangement 706.

The respective equations used in second level internal signals may be defined below:

$$X_1 = ((WE \cdot DATA) + \Delta) + RE$$

$$X_2 = ((WE \cdot \overline{DATA}) + \Delta) + RE$$

$$Y_1 = (\overline{WE \cdot DATA})$$

$$Y_2 = (\overline{WE \cdot DATA})$$

where "$\Delta$" is the pre-charge time to write. "$\Delta$" may be adjusted to achieve the level of pre-charge required for write/read operation.

The read circuit arrangement 710 may include a plurality of transistors to form a differential sense amplifier with outputs Q, $Q_b$.

Figure 8B:
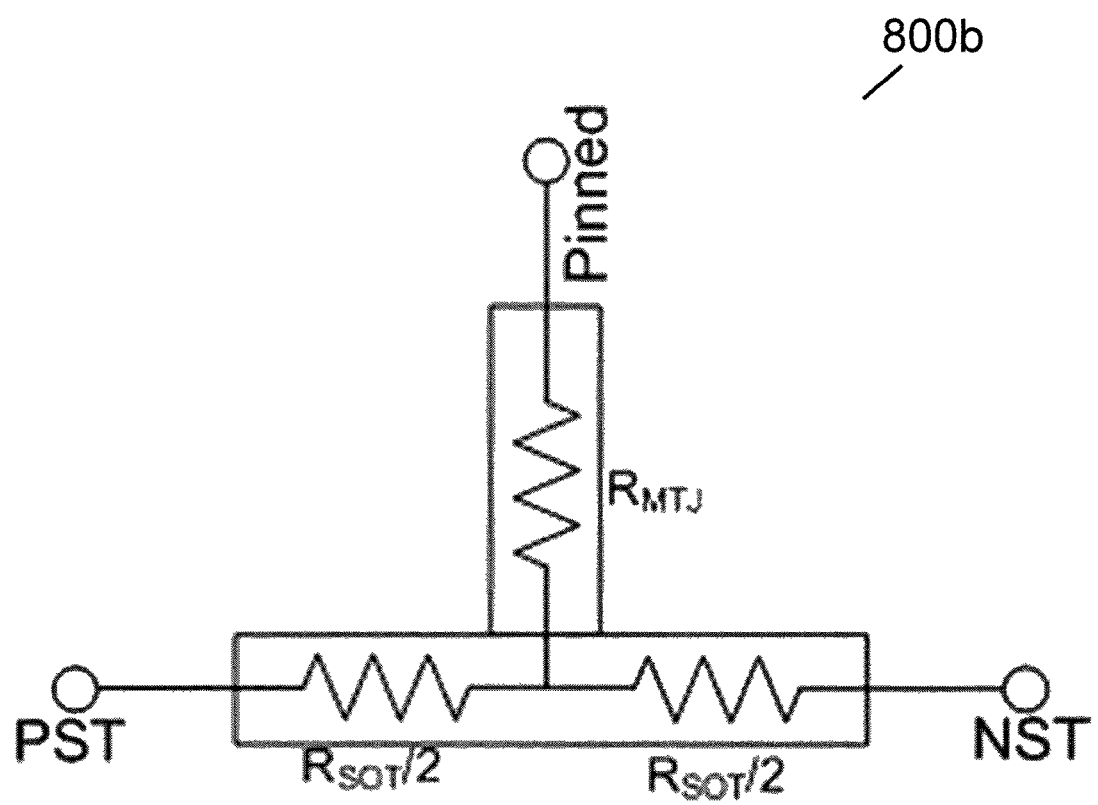
FIG. 8B is a schematic showing the various resistances of spin-orbit torque magnetic tunneling junction (SOT MTJ) cell according to various embodiments.

A test-bench has been designed to implement the non-volatile flip-flop based on spin-orbit torque effect with computer-aided design (CAD) tools. This test bench is implemented using a generic 45 nm process design kit. FIG. 8A is a table 800a showing the parameters used for the evaluation of the spin-orbit torque (SOT) switching of the spin-orbit torque magnetic tunneling junction (SOT MTJ) according to various embodiments. FIG. 8B is a schematic showing the various resistances of spin-orbit torque magnetic tunneling junction (SOT MTJ) cell 800b according to various embodiments. As highlighted earlier, the SOT electrode of the cell 800b may have a first electrode terminal (denoted by PST) and a second electrode terminal (denoted by NST). The MTJ of the cell 800b may have a reference terminal at the pinned layer of the MTJ (denoted by Pinned). The resistance due to the MTJ is denoted by $R_{MTJ}$, and the resistance of the SOT electrode is denoted by $R_{SOT}$.

Figure 9B:
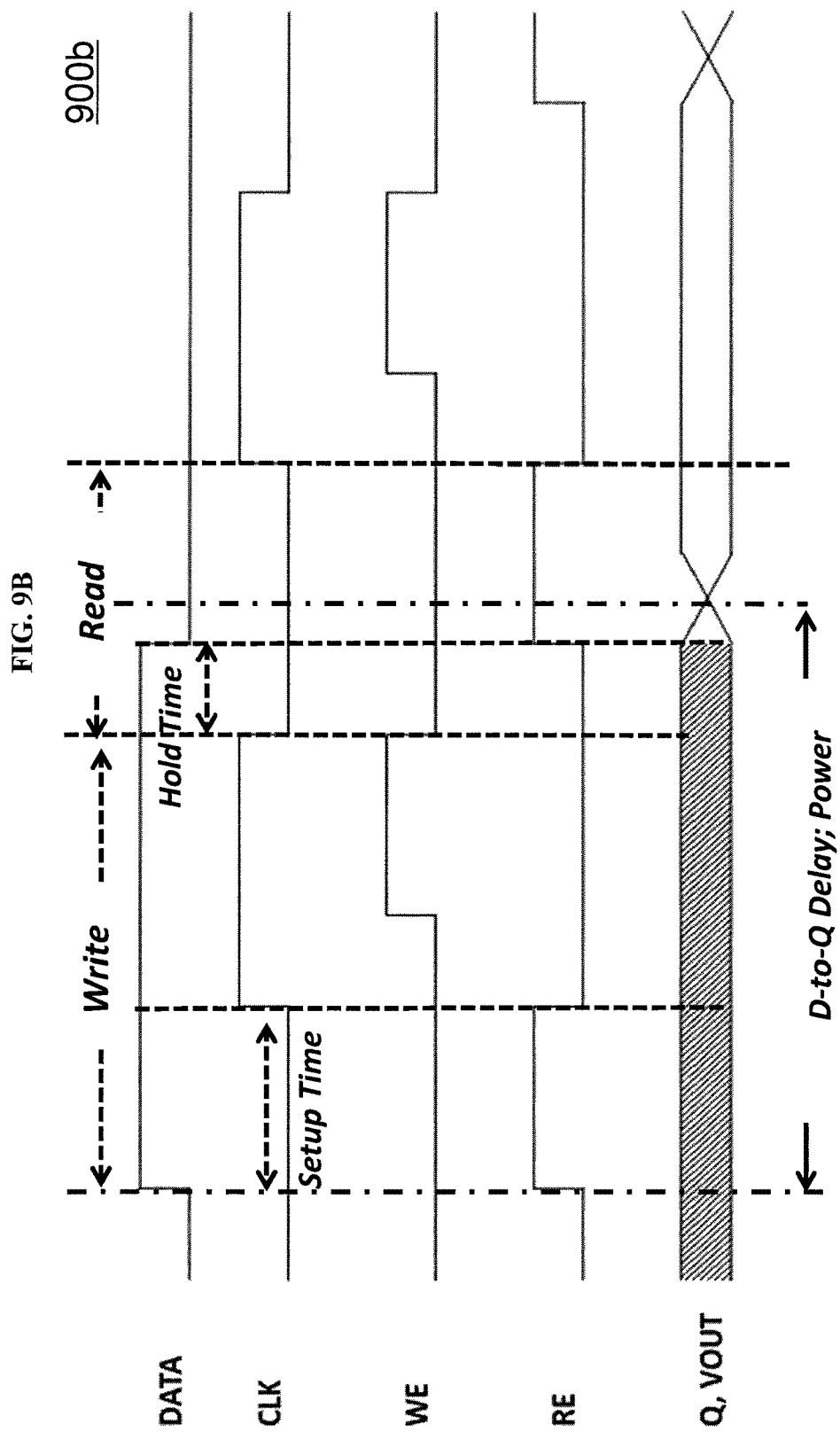
FIG. 9B is a timing diagram showing the input signal (DATA), clock signal (CLK), the write enable signal (WE), the read enable signal (RE) and the output signal (Q, VOUT) of the non-volatile flip-flop according to various embodiments.

A clock frequency of 1.25 GHz was used for the simulation of the test-bench. FIG. 9A is a timing diagram 900a the simulated input (D) and output (Q) waveforms together with the clock signal (CLK) and the power (Power) of the non-volatile flip-flop according to various embodiments. FIG. 9B is a timing diagram 900b showing the input signal (DATA), clock signal (CLK), the write enable signal (WE), the read enable signal (RE) and the output signal (Q, VOUT) of the non-volatile flip-flop according to various embodiments.

Figure 9C:
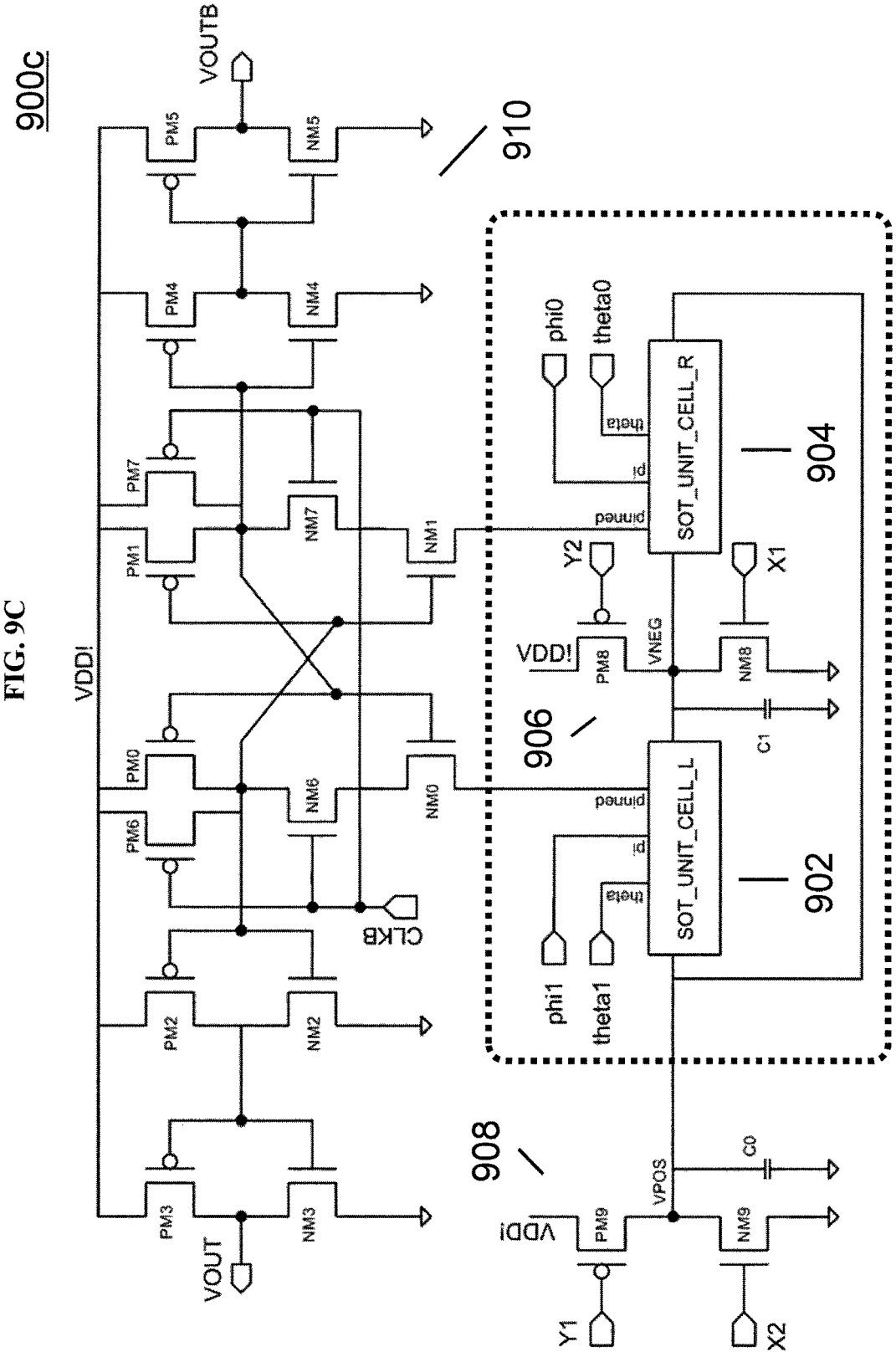
FIG. 9C is a schematic of the circuit arrangement according to various embodiments used in the simulation.

FIG. 9C is a schematic of the circuit arrangement 900c according to various embodiments used in the simulation. The circuit arrangement 900c may include SOT-MTJs 902, 904, a first driver circuit arrangement 906, a second driver circuit arrangements 908, and a read circuit arrangement 910.

Figure 9D:
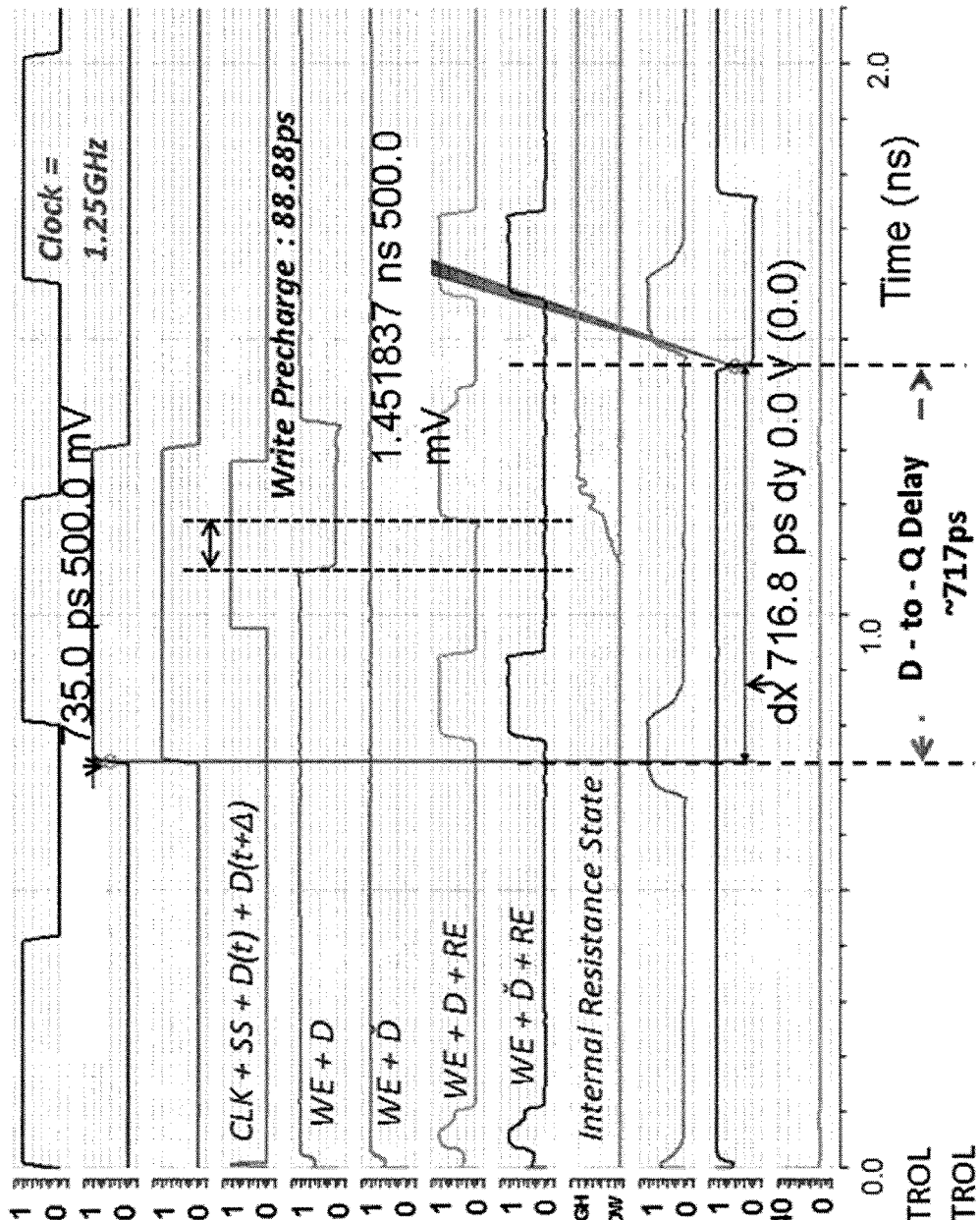
FIG. 9D is a timing diagram including the clock signal, input signal (denoted as data input), external write enable (WE) signal, internal write enable (WE) signal, internal write driver enable signals (denoted as $Y_1$, $Y_2$, $X_1$, $X_2$), internal resistance state (denoted as resistance), read enable signal, output (denoted as data output) and total power of the non-volatile flip-flop according to various embodiments showing writing of "1".
Figure 9E:
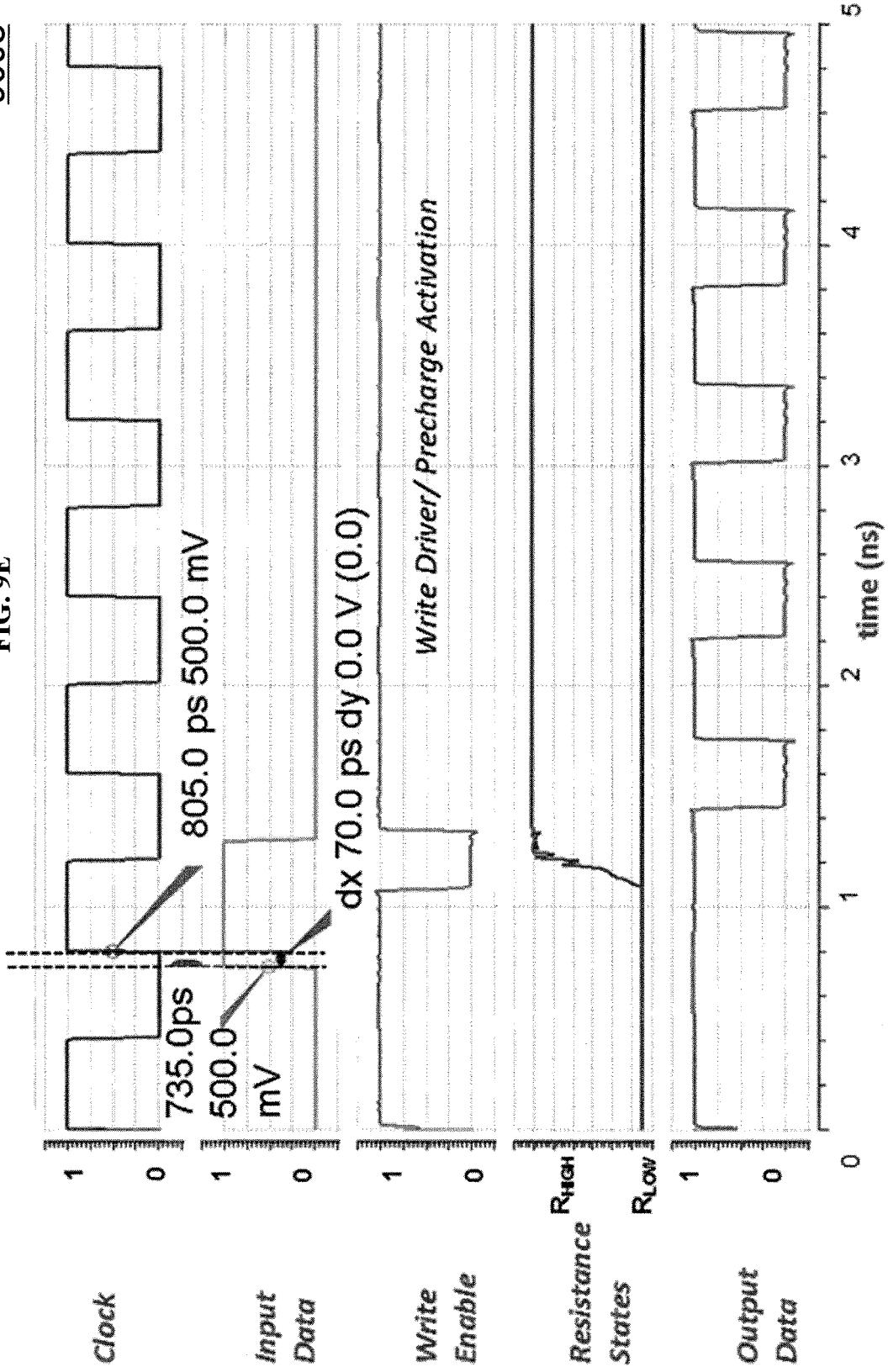
FIG. 9E is a timing diagram including the clock signal, input signal (denoted as data input), write enable signal, resistance state and output (denoted as output data) of the non-volatile flip-flop according to various embodiments showing the fast setup time of about 70 picoseconds (ps).
Figure 9F:
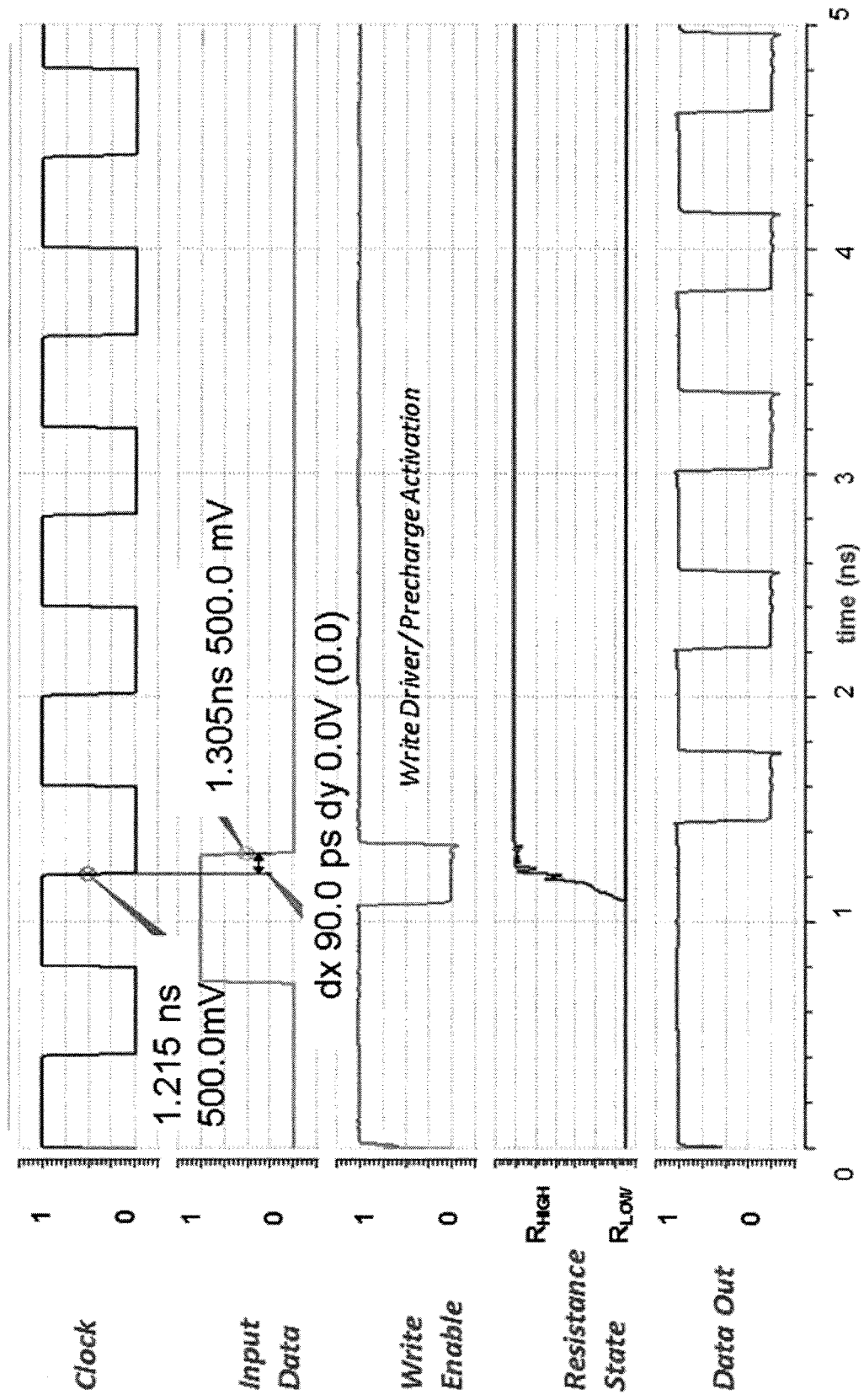
FIG. 9F is a timing diagram including the clock signal, input signal (denoted as data input), write enable signal, resistance state and output (denoted as output data) of the non-volatile flip-flop according to various embodiments showing the short hold time of about 90 picoseconds (ps).
Figure 9G:
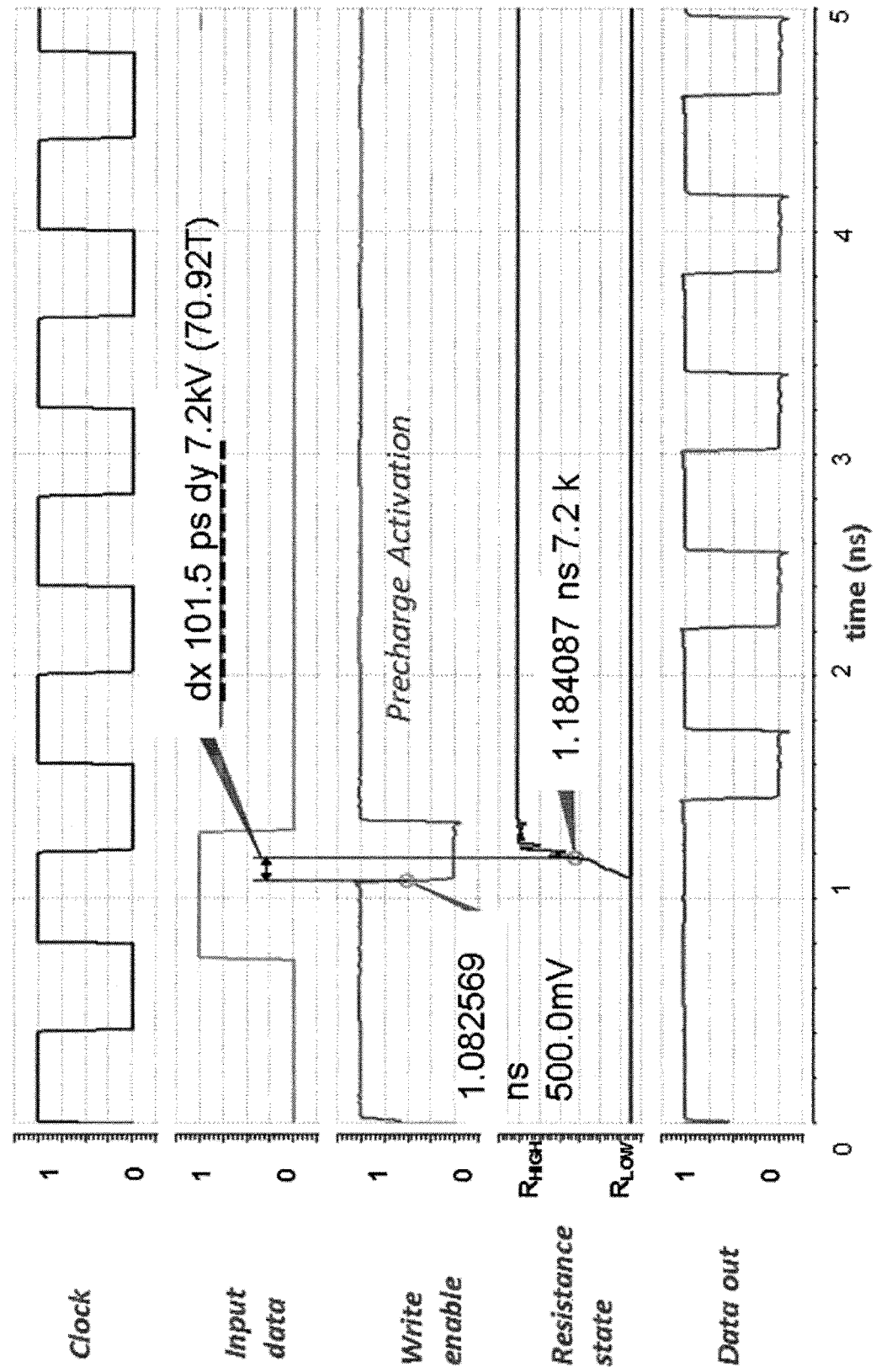
FIG. 9G is a timing diagram including the clock signal, input signal (denoted as data input), write enable signal, resistance state and output (denoted as output data) of the non-volatile flip-flop according to various embodiments showing the short cell switching time of about 102 picoseconds (ps).

FIG. 9D is a timing diagram 900d including the clock signal, input signal (denoted as data input), external write enable (WE) signal, internal write enable (WE) signal, internal write driver enable signals (denoted as $Y_1$, $Y_2$, $X_1$, $X_2$), internal resistance state (denoted as resistance), read enable signal, output (denoted as data output) and total power of the non-volatile flip-flop according to various embodiments showing writing of "1". A D-to-Q delay of 717 picoseconds (ps) has been attained based on the time duration taken from the input to the output "Q" signal. FIG. 9E is a timing diagram 900e including the clock signal, input signal (denoted as data input), write enable signal, resistance state and output (denoted as output data) of the non-volatile flip-flop according to various embodiments showing the fast setup time of about 70 picoseconds (ps). FIG. 9F is a timing diagram 900f including the clock signal, input signal (denoted as data input), write enable signal, resistance state and output (denoted as output data) of the non-volatile flip-flop according to various embodiments showing the short hold time of about 90 picoseconds (ps). FIG. 9G is a timing diagram 900g including the clock signal, input signal (denoted as data input), write enable signal, resistance state and output (denoted as output data) of the non-volatile flip-flop according to various embodiments showing the short cell switching time of about 102 picoseconds (ps). As shown in FIG. 9G, due to lower resistance along the write path, once the WE signal has been activated it takes about only 102 ps to switch the storage layer magnetization of the SOT-MTJ. This approach is faster compared to serial mode writing in which its resistance is at least two order higher.

Alternative programming methods may be sought together with SOT for improving the switching behavior in terms of speed and reduced requirement on SOT write drivers. The alternative switching methods may be but not limited to the use of SOT with either spin-transfer torque effect, electric-field effect or a combination of both switching mechanisms. This may facilitate faster switching and may lower the write current required to be supplied by the SOT write drivers. This may likely lead to greater reduction in the write driver dimension compared to write driver used in standalone SOT switching.

Figure 10:
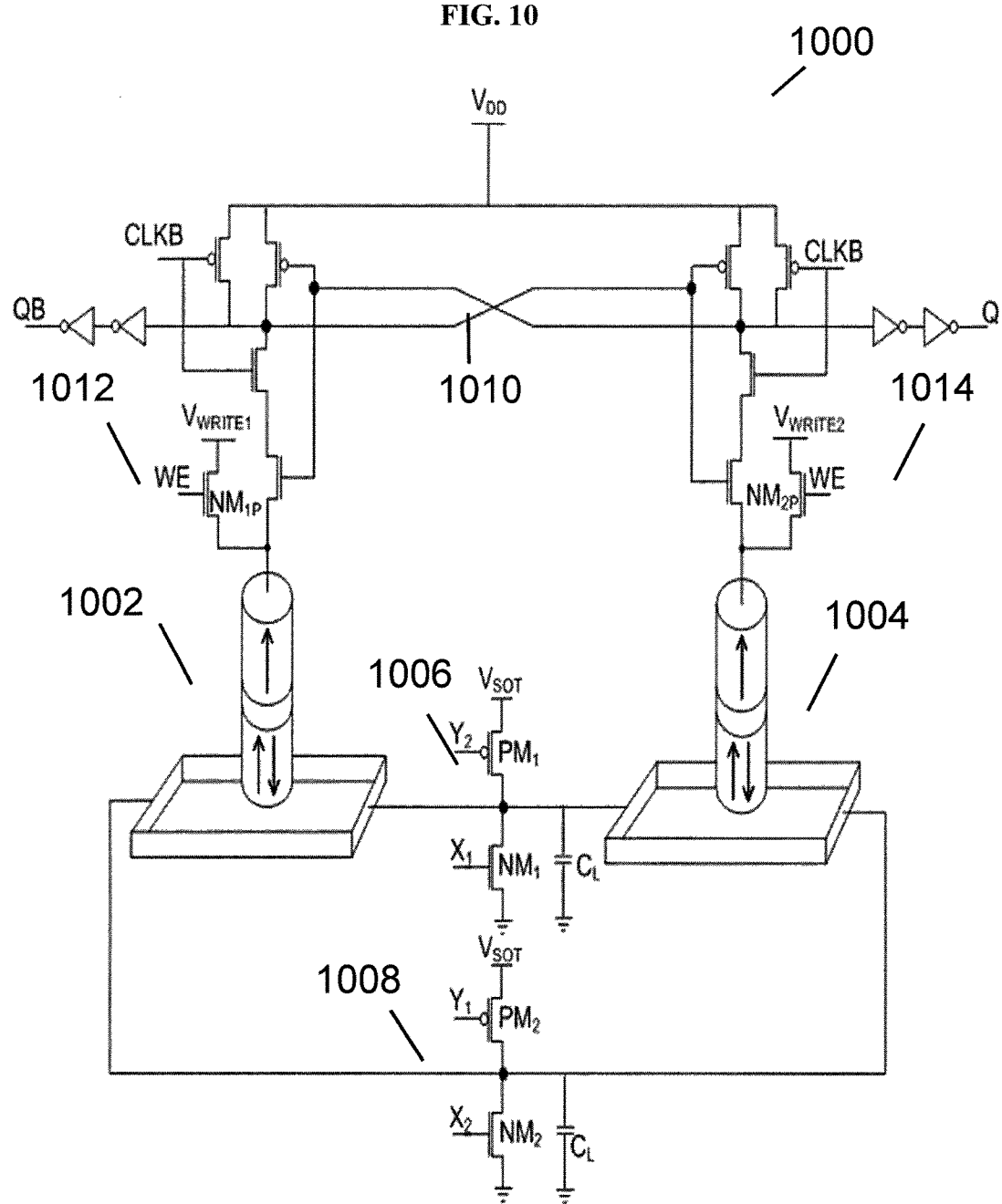
FIG. 10 is a schematic of a non-volatile flip-flop based on spin-orbit torque effect and either spin-transfer torque effect according to various embodiments.

FIG. 10 is a schematic of a non-volatile flip-flop 1000 based on spin-orbit torque effect and either spin-transfer torque effect according to various embodiments. The flip-flop 1000 may include a first spin-orbit torque magnetic tunnel junction cell 1002, a second spin-orbit torque magnetic tunnel junction cell 1004, a first driver circuit arrangement 1006, a second driver circuit arrangement 1008, and a read circuit arrangement 1010, which are similar to flip-flop 700 shown in FIG. 7.

The first driver circuit arrangement 1006 may include a n-channel metal oxide field effect transistor $NM_1$ and a p-channel metal oxide field effect transistor $PM_1$. A first controlled electrode of $PM_1$ may be connected to reference voltage $V_{SOT}$, while a second controlled electrode of $PM_1$ may be connected to the SOT electrodes of cells 1002, 1004. The control electrode of $PM_1$ may be configured to receive internal control signal $Y_2$. A first controlled electrode of $NM_1$ may be connected to the SOT electrodes of cells 1002, 1004 (and the second controlled electrode of $PM_1$), while a second controlled electrode of $NM_1$ may be connected to ground. The control electrode of $NM_1$ may be configured to receive internal control signal $X_1$.

The second driver circuit arrangement 1008 may include a n-channel metal oxide field effect transistor $NM_2$ and a p-channel metal oxide field effect transistor $PM_2$. A first controlled electrode of $PM_2$ may be connected to reference voltage $V_{SOT}$, while a second controlled electrode of $PM_2$ may be connected to the SOT electrodes of cells 1002, 1004. The control electrode of $PM_2$ may be configured to receive internal control signal $Y_1$. A first controlled electrode of $NM_2$ may be connected to the SOT electrodes of cells 1002, 1004 (and the second controlled electrode of $PM_2$), while a second controlled electrode of $NM_2$ may be connected to ground. The control electrode of $NM_2$ may be configured to receive internal control signal $X_2$.

The flip-flop 1000 may further include a third circuit arrangement including a first portion 1012 and a second portion 1014. The first portion 1012 may include a n-channel metal oxide field effect transistor $NM_{1P}$ including a first controlled electrode connected to a voltage $V_{WRITE1}$. The second controlled electrode of the transistor $NM_{1P}$ may be connected to a reference terminal of the cell 1002, which may be at the reference layer of the MTJ of cell 1002. A write enable signal (WE) may be provided to the control electrode of the transistor $NM_{1P}$.

The second portion 1014 may include a n-channel metal oxide field effect transistor $NM_{2P}$ including a first controlled electrode connected to a voltage $V_{WRITE2}$. The second controlled electrode of the transistor $NM_{2P}$ may be connected to a reference terminal of the cell 1004, which may be at the reference layer of the MTJ of cell 1004. The write enable signal (WE) may be provided to the control electrode of the transistor $NM_{2P}$.

As depicted in FIG. 10, the circuit arrangement in FIG. 7 may be slightly modified with the add-on third write driver circuit arrangement containing $NM_{1P}$ and $NM_{2P}$ with write controlled gate and voltage input terminals $V_{WRITE1}$, $V_{WRITE2}$. The existing control signal 'WE' may be used to control $NM_{1P}$ and $NM_{2P}$. The amplitude of the voltage input terminals may be equal or different depending on the efficiency of switching mechanism involved. The values of $V_{WRITE1}$ and $V_{WRITE2}$ may be made depending on the requirement and silicon estate availability. Keeping values of voltages $V_{WRITE1}$ and $V_{WRITE2}$ equal may lower the routing as well as the number of voltage generators required on chip, but may create asymmetric switching performance. When $V_{WRITE1}$ is of a different value compared to $V_{WRITE2}$, the asymmetry may be removed with a greater silicon area. Depending on the amplitude of $V_{WRITE1}$ and $V_{WRITE2}$, $NM_{1P}$ and $NM_{2P}$ may serve either as current sources or sinks. The SOT first driver circuit arrangement 1006 with $PM_1$, $NM_1$ and second driver circuit arrangement 1008 with $PM_2$, $NM_2$ may be shared between multiple switching mechanisms.

As an illustration, to store a digital '1', cell 1002 may be programmed as "1" and cell 1004 may be programmed as "0". The input signal (D) may be "1". $V_{WRITE1}$ may be equal to $V_{WRITE2}$, i.e. $V_{WRITE1}=V_{WRITE2}=+V_{WRITE}$. $PM_1$ in the first driver circuit arrangement 1006 may be activated or switched on so that the first driver circuit arrangement 1006 may act as SOT current source, $NM_2$ in the second driver circuit arrangement 1008 may be activated or switched on so that the second circuit driver circuit arrangement acts as a SOT current sink. $NM_1$ and $PM_2$ may be deactivated or switched off. The 'WE' signal may activate or switch on $NM_{1P}$ and $NM_{2P}$ in the third driver circuit arrangement 1012, 1014.

This scheme may enable two types of currents to flow simultaneously. An SOT current may flow from the first driver circuit arrangement 1006, split into sub-current of equal magnitudes which flow through the SOT electrodes before joining each other to flow to the second driver circuit arrangement 1008 ($V_{SOT} \rightarrow PM_1 \rightarrow$ SOT Electrodes in 1002, 1004 $\rightarrow NM_2 \rightarrow$ GND (ground)) which leads to SOT switching mechanism in cells 1002, 1004. In addition, STT currents of different amplitude (depends on MTJ resistance) may flow from the third driver circuit arrangement 1012, 1014 to the second driver circuit arrangement 1008. A first STT current may flow from $V_{WRITE1}$ through portion 1012 to the MTJ and electrode in cell 1002 to second circuit arrangement 1008 ($V_{WRITE} \rightarrow NM_{1P} \rightarrow$ MTJ in cell 1002 $\rightarrow$ SOT in cell 1002 $\rightarrow NM_2$ GND). A second STT current may flow from $V_{WRITE2}$ through portion 1014 to the MTJ and electrode in cell 1004 to second circuit arrangement 1008 ($V_{WRITE} \rightarrow NM_{2P} \rightarrow$ MTJ in cell 1004 $\rightarrow$ SOT in cell 1004 $\rightarrow NM_2 \rightarrow$ GND). Both the first STT current and the second STT current may contribute to the STT based switching mechanism.

The current flows through the SOT electrodes are opposite and away from each other. This allows the magnetization switching of the respective SOT MTJs to opposing logic states (high resistance state for cell 1002 and low resistance state for cell 1004). Cell 1002 may be programmed as "1" and cell 1004 may be programmed as "0".

Similarly to store a digital '0' in the complementary cells 1002, 1004, cell 1002 may be programmed as "0" and cell 1004 may be programmed as "1". The input signal D may be "0". $V_{WRITE1}$ may be equal to $V_{WRITE2}$, i.e. $V_{WRITE1} = V_{WRITE2} = +V_{WRITE}$. $NM_1$ in the first driver circuit arrangement 1006 may be activated or switched on so that the first driver circuit arrangement 1006 acts as a SOT current sink. $PM_2$ in the second driver circuit arrangement 1008 may be activated or switched on so that the second driver circuit arrangement 1008 acts as a SOT current source. $NM_2$ and $PM_1$ may be deactivated or switched off. The 'WE' signal may activate or switch on $NM_{1P}$ and $NM_{2P}$ in the third driver circuit arrangement 1012, 1014.

An SOT current may flow from the second driver circuit arrangement 1008, split into sub-currents which flow through the SOT electrodes before joining each other to flow to the first driver circuit arrangement 1008 ($V_{SOT} \rightarrow PM_2 \rightarrow$ SOT Electrodes in 1002, 1004 $\rightarrow NM_1 \rightarrow$ GND) which leads to SOT switching mechanism in cells 1002, 1004. In addition, STT currents of different amplitude (depends on MTJ resistance) may flow from the third driver circuit arrangement 1012, 1014 to the first circuit arrangement 1006. A first STT current may flow from $V_{WRITE1}$ through portion 1012 to the MTJ and electrode in cell 1002 to first circuit arrangement 1006 ($V_{WRITE} \rightarrow NM_{1P} \rightarrow$ MTJ in cell 1002 $\rightarrow$ SOT in cell 1002 $\rightarrow NM_1 \rightarrow$ GND). A second STT current may flow from $V_{WRITE2}$ through portion 1014 to the MTJ and electrode in cell 1004 to first circuit arrangement 1006 ($V_{WRITE} \rightarrow NM_{2P} \rightarrow$ MTJ in cell 1004 $\rightarrow$ SOT in cell 1004 $\rightarrow NM_1 \rightarrow$ GND). Both the first STT current and the second STT current may contribute to the STT based switching mechanism.

The current flows through the SOT electrodes are opposite and towards each other. This allows the magnetization switching of the respective SOT MTJs to opposing logic states (low resistance state for cell 1002 and high resistance state for cell 1004). Cell 1002 may be programmed as "0" and cell 1004 may be programmed as "1".

By using an unequal $V_{WRITE1}$ and $V_{WRITE2}$, a negative potential difference may be generated to divert a fraction of the SOT current into the MTJs to create STT effect. The current flow direction along MTJ may be reversed, which mimics a case of bi-directional STT effect.

As an illustration, to store a digital '1' from the input, the cell 1002 may be programmed as "1" and the cell 1004 may be programmed as "0". The input signal (D) may be "1". $V_{WRITE1}$ may not be equal to $V_{WRITE2}$ ($V_{WRITE1} = N_{WRITE}$ & $V_{WRITE2} = +V_{WRITE}$). $PM_1$ in the first driver circuit arrangement 1006 may be activated or switched on so that the first driver circuit arrangement 1006 may act as SOT current source, $NM_2$ in the second driver circuit arrangement 1008 may be activated or switched on so that the second circuit driver circuit arrangement 1008 acts as a SOT current sink. $NM_1$ and $PM_2$ may be deactivated or switched off. The 'WE' signal may activate or switch on $NM_{1P}$ and $NM_{2P}$ in the third driver circuit arrangement 1012, 1014.

As highlighted earlier, an SOT current may flow from the first driver circuit arrangement 1006, split into sub-current which flow through the SOT electrodes before joining each other to flow to the second driver circuit arrangement 1008 ($V_{SOT} \rightarrow PM_1 \rightarrow$ SOT electrodes in 1002, 1004 $\rightarrow NM_2 \rightarrow$ GND) which leads to SOT switching mechanism in cells 1002, 1004. Further, a first STT current may flow from the first driver circuit arrangement 1002 to the first portion 1012 ($V_{SOT} \rightarrow PM_1 \rightarrow$ SOT electrode in cell 1002 $\rightarrow$ MTJ in cell 1002 $\rightarrow NM_{1P} \rightarrow V_{WRITE1}$). A second STT current may flow from the second portion 1014 to the second driver circuit arrangement 1004 ($V_{WRITE2} \rightarrow NM_{2P} \rightarrow$ in cell 1004 $\rightarrow$ MTJ in 1004 $\rightarrow$ SOT electrode in cell 1004 $\rightarrow NM_2 \rightarrow$ GND).

The magnetizations in the MTJs of cells 1002, 1004 may be switched in opposite directions (high resistance state for cell 1002 and low resistance state for cell 1004). Cell 1002 may be programmed as "1" and cell 1004 may be programmed as "0".

The same can be applied for input (D) "0" with the appropriate $V_{WRITE1}$ and $V_{WRITE2}$ values. $PM_2$ in the second driver circuit arrangement 1008 may be activated or switched on so that the second driver circuit arrangement 1008 may act as SOT current source. $NM_1$ in the first driver circuit arrangement 1006 may be activated or switched on so that the first circuit driver circuit arrangement 1006 acts as a SOT current sink. $NM_2$ and $PM_1$ may be deactivated or switched off. The 'WE' signal may activate or switch on $NM_{1P}$ and $NM_{2P}$ in the third driver circuit arrangement 1012, 1014.

As highlighted earlier, an SOT current may flow from the second driver circuit arrangement 1008, split into sub-current which flow through the SOT electrodes before joining each other to flow to the first driver circuit arrangement 1006 ($V_{SOT} \rightarrow PM_2 \rightarrow$ SOT Electrodes in 1002, 1004 $\rightarrow NM_1 \rightarrow$ GND) which leads to SOT switching mechanism in cells 1002, 1004. Further, a third STT current may flow from the first portion 1012 to the first driver circuit arrangement 1006 ($V_{WRITE1} \rightarrow NM_{1P} \rightarrow$ MTJ in cell 1002 $\rightarrow$ SOT in cell 1002 $\rightarrow NM_1 \rightarrow$ GND). A fourth STT current may flow from the second driver circuit arrangement 1008 to the second portion 1014 ($V_{SOT} \rightarrow PM_2 \rightarrow$ SOT in cell 1004 $\rightarrow$ MTJ in cell 1004 $\rightarrow NM_{2P} \rightarrow V_{WRITE2}$).

The magnetizations in the MTJs of cells 1002, 1004 may be switched in opposite directions (low resistance state for cell 1002 and high resistance state for cell 1004). Cell 1002 may be programmed as "0" and cell 1004 may be programmed as "1".

The transistors in $NM_{1P}$ and $NM_{2P}$ in the third driver circuit arrangement 1012, 1014 may be realized or substituted with a transmission gate or any suitable switching elements.

FIG. 11A is a table 1100*a* comparing parallel writing according to various embodiments with conventional serial writing. The power increase may be attributable to both power increase in memory core and extra peripheral elements involved in logic calculation for the parallel scheme. Power increase in the memory core may be due to the parallel scheme. Further, the peripheral circuits involved in parallel writing may be different from that in serial writing due to different logics involved, which also contribute to increased power consumption for parallel writing.

FIG. 11B is a table 1000*b* comparing two parallel writing schemes according to various embodiments with conventional serial writing. The two parallel writing schemes may use two different clock frequencies of 1.25 gigahertzs (GHz) and 1 GHz. Parallel Write (1) and Parallel Write (2) refer to writing at different clock speeds using the circuit arrangement shown in FIG. 7. The general figures of merit of the flip-flop, such as setup time and hold time, are in picoseconds regime, and are comparable to complementary metal oxide semiconductors (CMOS) based flip-flops. The input to output (D-to-Q) delay attained is about 717 ps and 825.7 ps for the two parallel writing schemes.

Figure 12A:
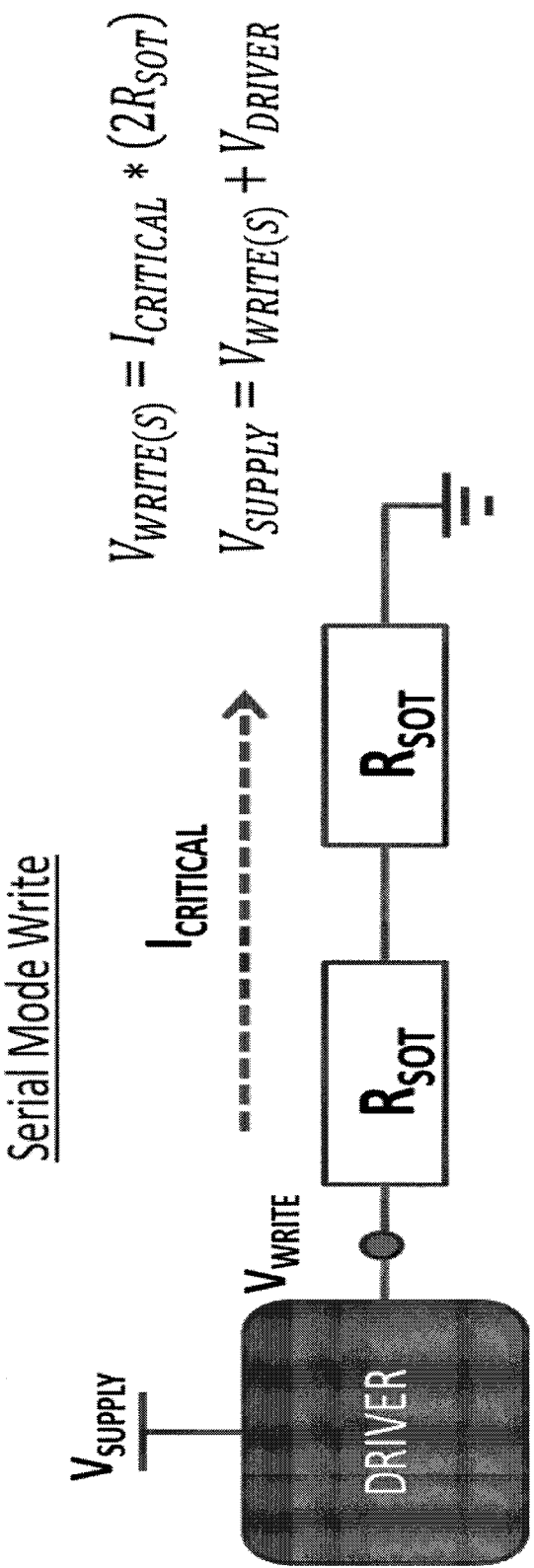
FIG. 12A shows a serial writing scheme.
Figure 12B:
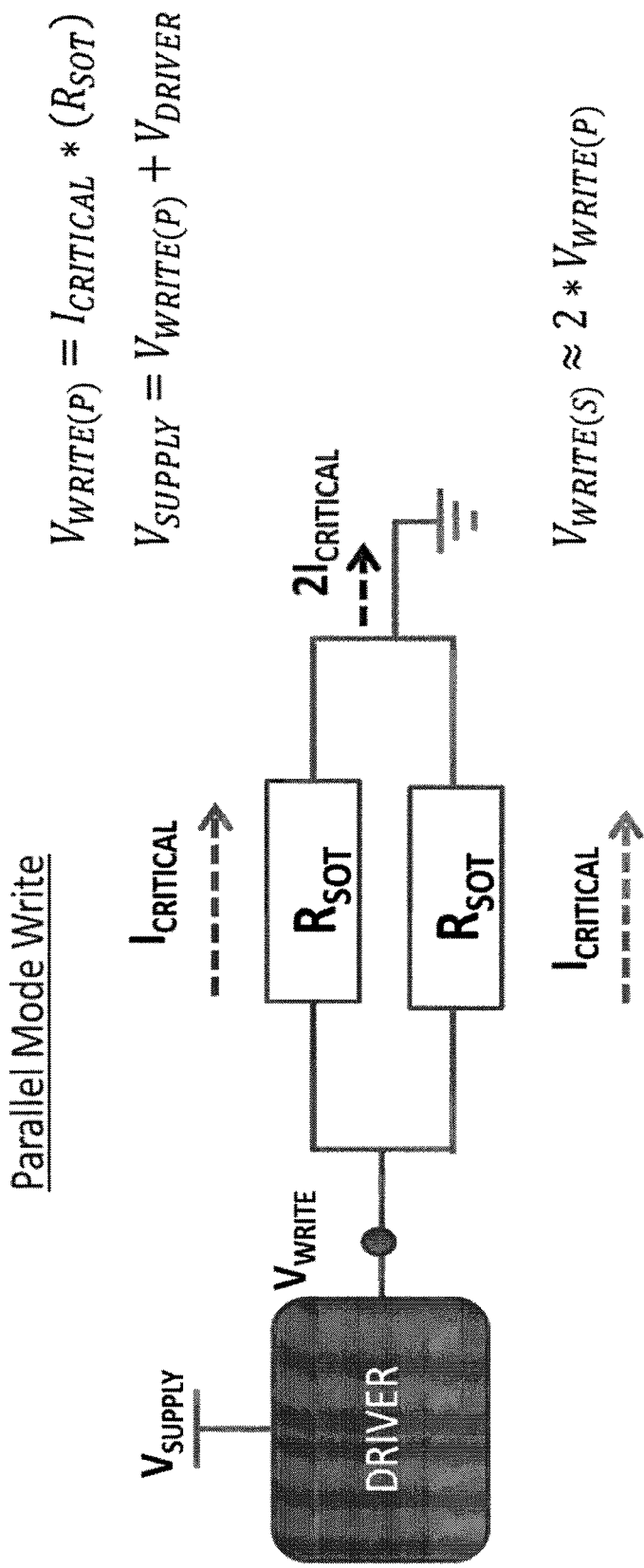
FIG. 12B shows a parallel writing scheme according to various embodiments.

FIG. 12A shows a serial writing scheme. FIG. 12B shows a parallel writing scheme according to various embodiments. It can be seen from FIGS. 12A-B that the parallel mode configuration allows for better scaling of supply voltage as compared to a serial configuration.

Figure 13:
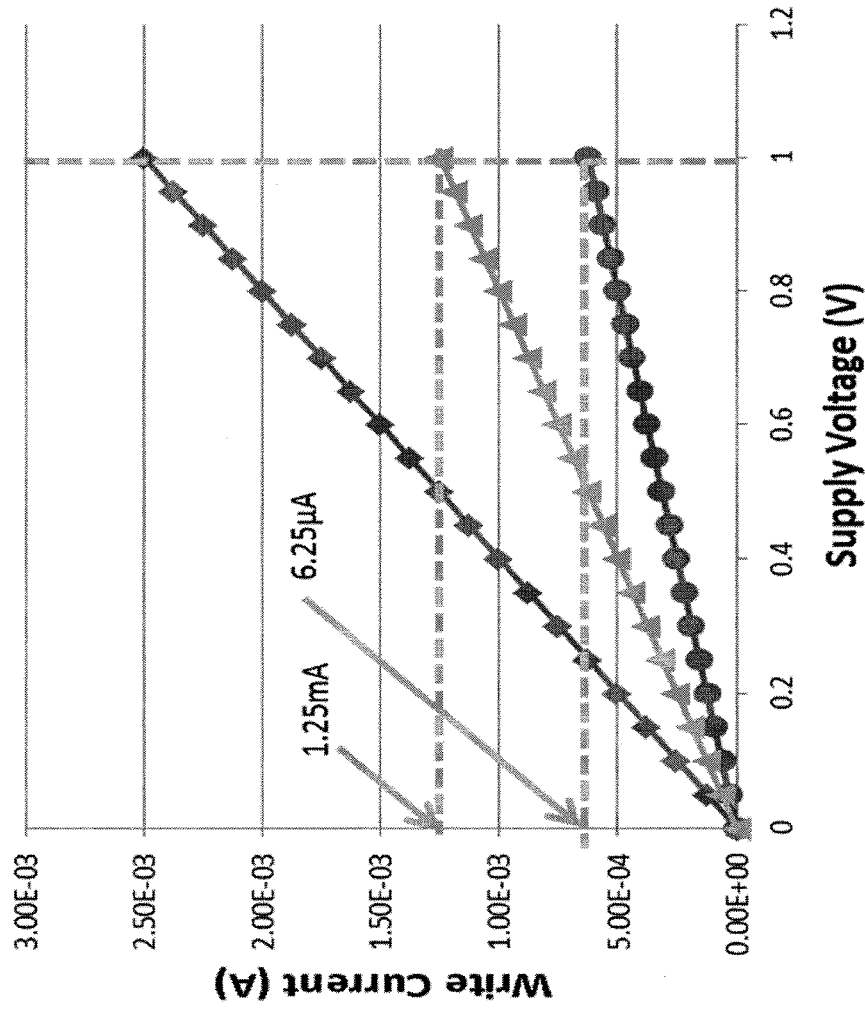
FIG. 13 is a plot of write current (amperes or A) as a function of supply voltage (volts or V) showing that the parallel mode of writing offers better scaling of supply voltage as compared to the serial mode.

FIG. 13 is a plot 1300 of write current (amperes or A) as a function of supply voltage (volts or V) showing that the parallel mode of writing offers better scaling of supply voltage as compared to the serial mode. The simulation is carried out excluding parasitic components along the wire, and assumes that the current flow along the MTJ is negligible compared to the write current and therefore can be omitted. From the circuit evaluation of both parallel and serial schemes as shown in FIG. 13, it is observed that the serial mode may require approximately twice the write voltage for generating the same amount of critical write current compared to parallel scheme. This may beneficial in low-voltage sub-threshold designs.

Various embodiments may include parallel mode complementary SOT MTJs for a flip-flop. Various embodiments may relate to a pre-charge parallel write scheme for SOT flip-flop.

Various embodiments may provide simplified routing in reversing cell terminals. Various embodiments may allow identical or similar SOT MTJs stack to be fabricated using normal operation flow. Various embodiments may adopt pre-charge based write scheme, which may increase the probability of MTJ switching with more even distribution of write speed compared to the serial write scheme, and/or better clock frequency operation. Various embodiments may possess a lower D-to-Q delay due to the two discharge paths reading read. In various embodiments, the supply voltage may be scalable.

However, in various embodiments, there may be increased power consumption due to extra circuits involved. Various embodiments may require increased driver size due to 2 different current paths.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A circuit arrangement comprising:
   a first spin-orbit torque magnetic tunnel junction cell having a reference terminal, a first electrode terminal, and a second electrode terminal;
   a second spin-orbit torque magnetic tunnel junction cell having a reference terminal, a first electrode terminal, and a second electrode terminal;
   a first driver circuit arrangement connected to the second electrode terminal of the first spin-orbit torque magnetic tunnel junction cell and the first electrode terminal of the second spin-orbit torque magnetic tunnel junction cell;
   a second driver circuit arrangement connected to the first electrode terminal of the first spin-orbit torque magnetic tunnel junction cell and the second electrode terminal of the second spin-orbit torque magnetic tunnel junction cell;
   a read circuit arrangement connected to the reference terminal of the first spin-orbit torque magnetic tunnel junction cell and the reference terminal of the second spin-orbit torque magnetic tunnel junction cell;
   wherein the first driver circuit arrangement and the second driver circuit arrangement are configured so that a first write current flowing from the first driver circuit arrangement to the second driver circuit arrangement generates a first logic state in the first spin-orbit torque magnetic tunnel junction cell and a second logic state in the second spin-orbit torque magnetic tunnel junction cell, and a second write current flowing from the second driver circuit arrangement to the first driver circuit arrangement generates the second logic state in the first spin-orbit torque magnetic tunnel junction cell and the first logic state in the second spin-orbit torque magnetic tunnel junction cell; and
   wherein the read circuit arrangement is configured to flow a first sense current through the first spin-orbit torque magnetic tunnel junction cell and a second sense current through the second spin-orbit torque magnetic tunnel junction cell for determining a logic state of the first spin-orbit torque magnetic tunnel junction cell and a logic state of the second spin-orbit torque magnetic tunnel junction cell.

2. The circuit arrangement according to claim 1, wherein the first spin-orbit torque magnetic tunnel junction cell comprises:
   a magnetic tunneling junction; and
   an electrode in contact with the magnetic tunneling junction; and
   wherein the second spin-orbit torque magnetic tunnel junction cell comprises:
   a magnetic tunneling junction; and
   an electrode in contact with the magnetic tunneling junction.

3. The circuit arrangement according to claim 1,
wherein the first electrode terminal of the first spin-orbit torque magnetic tunnel junction cell is at a first end of the electrode of the first spin-orbit torque magnetic tunnel junction cell;
wherein the second electrode terminal of the first spin-orbit torque magnetic tunnel junction cell is at a second end of the electrode of the first spin-orbit torque magnetic tunnel junction cell;
wherein the first electrode terminal of the second spin-orbit torque magnetic tunnel junction cell is at a first end of the electrode of the second spin-orbit torque magnetic tunnel junction cell; and
wherein the second electrode terminal of the second spin-orbit torque magnetic tunnel junction cell is at a second end of the electrode of the second spin-orbit torque magnetic tunnel junction cell.

4. The circuit arrangement according to claim 2,
wherein the magnetic tunneling junction of the first spin-orbit torque magnetic tunnel junction cell comprises:
a reference layer having a fixed magnetization;
a storage layer configured to switch between a first magnetization state and a second magnetization state; and
a tunneling barrier separating the reference layer and the storage layer.

5. The circuit arrangement according to claim 4,
wherein the reference terminal of the first spin-orbit torque magnetic tunnel junction cell is at the reference layer of the magnetic tunneling junction of the first spin-orbit torque magnetic tunnel junction cell.

6. The circuit arrangement according to claim 4,
wherein the first spin-orbit torque magnetic tunnel junction cell is configured so that the first logic state of the first spin-orbit torque magnetic tunnel junction cell is generated when the storage layer of the first spin-orbit torque magnetic tunnel junction cell is at the first magnetization state; and
wherein the first spin-orbit torque magnetic tunnel junction cell is configured so that the second logic state of the first spin-orbit torque magnetic tunnel junction cell is generated when the storage layer of the first spin-orbit torque magnetic tunnel junction cell is at the second magnetization state.

7. The circuit arrangement according to claim 2,
wherein the second magnetic tunneling junction of the second spin-orbit torque magnetic tunnel junction cell comprises:
a reference layer having a fixed magnetization;
a storage layer configured to switch between a first magnetization state and a second magnetization state; and
a tunneling barrier separating the reference layer and the storage layer.

8. The circuit arrangement according to claim 7,
wherein the reference terminal of the second spin-orbit torque magnetic tunnel junction cell is at the reference layer of the magnetic tunneling junction of the first spin-orbit torque magnetic tunnel junction cell.

9. The circuit arrangement according to claim 7,
wherein the second spin-orbit torque magnetic tunnel junction cell is configured so that the first logic state of the second spin-orbit torque magnetic tunnel junction cell is generated when the storage layer of the second spin-orbit torque magnetic tunnel junction cell is at the first magnetization state; and
wherein the second spin-orbit torque magnetic tunnel junction cell is configured so that the second logic state of the second spin-orbit torque magnetic tunnel junction cell is generated when the storage layer of the second spin-orbit torque magnetic tunnel junction cell is at the second magnetization state.

10. The circuit arrangement according to claim 1,
wherein the read circuit arrangement comprises a differential sense amplifier, the differential sense amplifier comprising:
a first input connected to the reference terminal of the first spin-orbit torque magnetic tunnel junction cell; and
a second input connected to the reference terminal of the second spin-orbit torque magnetic tunnel junction cell.

11. The circuit arrangement according to claim 10,
wherein the differential sense amplifier is configured to generate an output based on the determination of the logic state of the first spin-orbit torque magnetic tunnel junction cell and the logic state of the second spin-orbit torque magnetic tunnel junction cell.

12. The circuit arrangement according to claim 1,
wherein the first driver circuit arrangement is configured to receive a clock signal and a first input voltage; and
wherein the second driver circuit arrangement is configured to receive the clock signal and a second input voltage.

13. The circuit arrangement according to claim 12,
wherein the first driver circuit arrangement is configured to generate a first voltage based on the clock signal, and the first input voltage; and
wherein the second driver circuit arrangement is configured to generate a second voltage based on the clock signal, and the second input voltage.

14. The circuit arrangement according to claim 13,
wherein the first write current flows from the first driver circuit arrangement to the second driver circuit arrangement when the first voltage is higher than the second voltage; and
wherein the second write current flows from the second driver circuit arrangement to the first driver circuit arrangement when the second voltage is higher than the first voltage.

15. The circuit arrangement according to claim 1,
wherein the circuit arrangement is a non-volatile flip-flop.

16. A method of forming a circuit arrangement, the method comprising:
providing a first spin-orbit torque magnetic tunnel junction cell having a reference terminal, a first electrode terminal, and a second electrode terminal;
providing a second spin-orbit torque magnetic tunnel junction cell having a reference terminal, a first electrode terminal, and a second electrode terminal;
connecting a first driver circuit arrangement to the second electrode terminal of the first spin-orbit torque magnetic tunnel junction cell and the first electrode terminal of the second spin-orbit torque magnetic tunnel junction cell;
connecting a second driver circuit arrangement to the first electrode terminal of the first spin-orbit torque magnetic tunnel junction cell and the second electrode terminal of the second spin-orbit torque magnetic tunnel junction cell;
connecting a read circuit arrangement to the reference terminal of the first spin-orbit torque magnetic tunnel junction cell and the reference terminal of the second spin-orbit torque magnetic tunnel junction cell;

wherein the first driver circuit arrangement and the second driver circuit arrangement are configured so that a first write current flowing from the first driver circuit arrangement to the second driver circuit arrangement generates a first logic state in the first spin-orbit torque magnetic tunnel junction cell and a second logic state in the second spin-orbit torque magnetic tunnel junction cell, and a second write current flowing from the second driver circuit arrangement to the first driver circuit arrangement generates the second logic state in the first spin-orbit torque magnetic tunnel junction cell and the first logic state in the second spin-orbit torque magnetic tunnel junction cell; and wherein the read circuit arrangement is configured to flow a first sense current through the first spin-orbit torque magnetic tunnel junction cell and a second sense current through the second spin-orbit torque magnetic tunnel junction cell for determining a logic state of the first spin-orbit torque magnetic tunnel junction cell and a logic state of the second spin-orbit torque magnetic tunnel junction cell.

17. A method of operating a circuit arrangement, the method comprising:

providing the circuit arrangement comprising:
- a first spin-orbit torque magnetic tunnel junction cell having a reference terminal, a first electrode terminal, and a second electrode terminal;
- a second spin-orbit torque magnetic tunnel junction cell having a reference terminal, a first electrode terminal, and a second electrode terminal;
- a first driver circuit arrangement connected to the second electrode terminal of the first spin-orbit torque magnetic tunnel junction cell and the first electrode terminal of the second spin-orbit torque magnetic tunnel junction cell;
- a second driver circuit arrangement connected to the first electrode terminal of the first spin-orbit torque magnetic tunnel junction cell and the second electrode terminal of the second spin-orbit torque magnetic tunnel junction cell;
- a read circuit arrangement connected to the reference terminal of the first spin-orbit torque magnetic tunnel junction cell and the reference terminal of the second spin-orbit torque magnetic tunnel junction cell;

wherein the first driver circuit arrangement and the second driver circuit arrangement are configured so that a first write current flowing from the first driver circuit arrangement to the second driver circuit arrangement generates a first logic state in the first spin-orbit torque magnetic tunnel junction cell and a second logic state in the second spin-orbit torque magnetic tunnel junction cell, and a second write current flowing from the second driver circuit arrangement to the first driver circuit arrangement generates the second logic state in the first spin-orbit torque magnetic tunnel junction cell and the first logic state in the second spin-orbit torque magnetic tunnel junction cell; and wherein the read circuit arrangement is configured to flow a first sense current through the first spin-orbit torque magnetic tunnel junction cell and a second sense current through the second spin-orbit torque magnetic tunnel junction cell for determining a logic state of the first spin-orbit torque magnetic tunnel junction cell and a logic state of the second spin-orbit torque magnetic tunnel junction cell; and writing to the first spin-orbit torque magnetic tunnel junction cell and the second spin-orbit torque magnetic tunnel junction cell.

18. The method according to claim 17, wherein writing to the first spin-orbit torque magnetic tunnel junction cell and the second spin-orbit torque magnetic tunnel junction cell comprises:
- providing a clock signal to the first driver circuit arrangement and the second driver circuit arrangement;
- providing a first input to the first driver circuit arrangement; and
- providing a second input to the second driver circuit arrangement.

19. The method according to claim 17, the method comprising:

determining the logic state of the first spin-orbit torque magnetic tunnel junction cell and the logic state of the second spin-orbit torque magnetic tunnel junction cell.

20. The method according to claim 19, wherein determining the logic state of the first spin-orbit torque magnetic tunnel junction cell and the logic state of the second spin-orbit torque magnetic tunnel junction cell comprises:
- connecting the first electrode terminal and second electrode terminal of the first spin-orbit torque magnetic tunnel junction cell to ground;
- connecting the first electrode terminal and second electrode terminal of the second spin-orbit torque magnetic tunnel junction cell to ground;
- providing the first sense current through the first spin-orbit torque magnetic tunnel junction cell and a second sense current through the second spin-orbit torque magnetic tunnel junction cell to determine the logic state of the first spin-orbit torque magnetic tunnel junction cell and the logic state of the second spin-orbit torque magnetic tunnel junction cell.

* * * * *

UNITED STATES PATENT AND TRADEMARK OFFICE
CERTIFICATE OF CORRECTION

PATENT NO.       : 10,453,511 B2
APPLICATION NO.  : 16/079511
DATED            : October 22, 2019
INVENTOR(S)      : Sunny Yan Hwee Lua et al.

It is certified that error appears in the above-identified patent and that said Letters Patent is hereby corrected as shown below:

In the Claims

Claim 1, Column 22, Lines 35-47:
Please replace the phrase "wherein the first driver circuit arrangement and the second driver circuit arrangement are configured so that a first write current flowing from the first driver circuit arrangement to the second driver circuit arrangement generates a first logic state in the first spin-orbit torque magnetic tunnel junction cell and a second logic state in the second spin-orbit torque magnetic tunnel junction cell, and a second write current flowing from the second driver circuit arrangement to the first driver circuit arrangement generates the second logic state in the first spin-orbit torque magnetic tunnel junction cell and the first logic state in the second spin-orbit torque magnetic tunnel junction cell" with --wherein the first driver circuit arrangement and the second driver circuit arrangement are configured so that a first write current flowing from the first driver circuit arrangement to the second driver circuit arrangement generates a first logic state in the first spin-orbit torque magnetic tunnel junction cell via a first sub-current, and a second logic state in the second spin-orbit torque magnetic tunnel junction cell via a second sub-current flowing in an opposite direction away from the first sub-current, and a second write current flowing from the second driver circuit arrangement to the first driver circuit arrangement generates the second logic state in the first spin-orbit torque magnetic tunnel junction cell via a third sub-current, and the first logic state in the second spin-orbit torque magnetic tunnel junction cell via a fourth sub-current flowing in an opposite direction towards the third sub-current--.

Claim 16, Column 25, Lines 3-15:
Please replace the phrase "wherein the first driver circuit arrangement and the second driver circuit arrangement are configured so that a first write current flowing from the first driver circuit arrangement to the second driver circuit arrangement generates a first logic state in the first spin-orbit torque magnetic tunnel junction cell and a second logic state in the second spin-orbit torque magnetic tunnel junction cell, and a second write current flowing from the second driver circuit arrangement to the first driver circuit arrangement generates the second logic state in the first spin-orbit torque magnetic tunnel junction cell and the first logic state in the second spin-orbit torque magnetic tunnel junction cell" with --wherein the first driver circuit arrangement and the second driver circuit Signed and Sealed this
Twenty-second Day of September, 2020

Andrei Iancu
*Director of the United States Patent and Trademark Office* arrangement are configured so that a first write current flowing from the first driver circuit arrangement to the second driver circuit arrangement generates a first logic state in the first spin-orbit torque magnetic tunnel junction cell via a first sub-current, and a second logic state in the second spin-orbit torque magnetic tunnel junction cell via a second sub-current flowing in an opposite direction away from the first sub-current, and a second write current flowing from the second driver circuit arrangement to the first driver circuit arrangement generates the second logic state in the first spin-orbit torque magnetic tunnel junction cell via a third sub-current, and the first logic state in the second spin-orbit torque magnetic tunnel junction cell via a fourth sub-current flowing in an opposite direction towards the third sub-current--.

Claim 17, Column 25, Line 47 – Column 26, Line 7:
Please replace the phrase "wherein the first driver circuit arrangement and the second driver circuit arrangement are configured so that a first write current flowing from the first driver circuit arrangement to the second driver circuit arrangement generates a first logic state in the first spin-orbit torque magnetic tunnel junction cell and a second logic state in the second spin-orbit torque magnetic tunnel junction cell, and a second write current flowing from the second driver circuit arrangement to the first driver circuit arrangement generates the second logic state in the first spin-orbit torque magnetic tunnel junction cell and the first logic state in the second spin-orbit torque magnetic tunnel junction cell" with --wherein the first driver circuit arrangement and the second driver circuit arrangement are configured so that a first write current flowing from the first driver circuit arrangement to the second driver circuit arrangement generates a first logic state in the first spin-orbit torque magnetic tunnel junction cell via a first sub-current, and a second logic state in the second spin-orbit torque magnetic tunnel junction cell via a second sub-current flowing in an opposite direction away from the first sub-current, and a second write current flowing from the second driver circuit arrangement to the first driver circuit arrangement generates the second logic state in the first spin-orbit torque magnetic tunnel junction cell via a third sub-current, and the first logic state in the second spin-orbit torque magnetic tunnel junction cell via a fourth sub-current flowing in an opposite direction towards the third sub-current--.